(12) United States Patent
Kumar

(10) Patent No.: US 8,654,889 B2
(45) Date of Patent: Feb. 18, 2014

(54) ADAPTIVE COMPENSATION SYSTEMS FOR MITIGATING DISTORTION DUE TO NONLINEAR POWER AMPLIFIERS

(75) Inventor: Rajendra Kumar, Cerritos, CA (US)

(73) Assignee: The Aerospace Corporation, El Segundo, CA (US)

( * ) Notice: Subject to any disclaimer, the term of this patent is extended or adjusted under 35 U.S.C. 154(b) by 874 days.

(21) Appl. No.: 12/798,026

(22) Filed: Mar. 26, 2010

(65) Prior Publication Data

US 2011/0234314 A1   Sep. 29, 2011

(51) Int. Cl.
*H04L 25/49* (2006.01)

(52) U.S. Cl.
USPC .......................................... 375/296; 330/149

(58) Field of Classification Search
USPC ...................... 375/296, 297; 330/149, 75, 118
See application file for complete search history.

(56) References Cited

U.S. PATENT DOCUMENTS

| | | | |
|---|---|---|---|
| 6,304,140 B1 | 10/2001 | Thron et al. | |
| 6,489,846 B2 | 12/2002 | Hatsugai | |
| 6,642,786 B1 | 11/2003 | Jin et al. | |
| 6,928,272 B2* | 8/2005 | Doi ............................ | 455/114.2 |
| 7,113,036 B2* | 9/2006 | Moffatt et al. ................ | 330/149 |
| 7,529,524 B1 | 5/2009 | Giallorenzi et al. | |
| 8,059,748 B2 | 11/2011 | See et al. | |
| 2003/0231716 A1* | 12/2003 | Unger .......................... | 375/296 |

FOREIGN PATENT DOCUMENTS

GB       2394374 A    4/2004

OTHER PUBLICATIONS

International Search Report and Written Opinion of the International Searching Authority mailed in Application No. PCT/US2011/022600 on Jun. 8, 2011.
A. Katz, "Linearization: Reducing Distortion in Power Amplifiers," IEEE Microwave Magazine, pp. 37-49, Dec. 2001.
R. Kumar, "Analysis of the Impact of Clock Jitter Noise on the Performance of Analog-to-Digital Converters," Proc. AIAA International Communication Satellite Systems Conference, pp. 1-10, May 2008, San Diego, California.
A. M. Saleh, "Frequency-Independent and Frequency Dependent Nonlinear Models of TWT Amplifiers," IEEE Transactions on Communications, vol. COM-29, No. 11, Nov. 1981, pp. 1715-1720.
R. Kumar, U.S. Appl. No. 13/102,903, filed May 6, 2011 and entitled, "Systems and Methods for Mitigating Spectral Regrowth from Non-Linear Systems."

* cited by examiner

*Primary Examiner* — Shuwang Liu
*Assistant Examiner* — David Huang
(74) *Attorney, Agent, or Firm* — K & L Gates LLP

(57) ABSTRACT

A method for pre-processing a signal prior to receipt of the signal by a non-linear device (NLD) to compensate for AM-AM distortion and AM-PM distortion of the signal by the NLD. The method includes generating a modified amplitude $r_k$ based on an amplitude $x_k$ derived from a digitized envelope $R_{i,k}$ of the signal, generating a scale factor $c_k$ based on the modified amplitude $r_k$ and the amplitude $x_k$, generating an AM-AM compensated signal based on the scale factor $c_k$, generating a first AM-PM phase compensation value based on the modified amplitude $r_k$, and generating an AM-AM and AM-PM compensated signal by modifying a phase of the AM-AM compensated signal based on the first AM-PM phase compensation value.

32 Claims, 26 Drawing Sheets

ADAPTIVE COMPENSATION SYSTEMS FOR MITIGATING DISTORTION DUE TO NONLINEAR POWER AMPLIFIERS

STATEMENT REGARDING FEDERALLY SPONSORED RESEARCH OR DEVELOPMENT

This invention was made with government support under Contract No. FA8802-09-C-0001 awarded by the Department of the Air Force. The government has certain rights in the invention.

BACKGROUND

The power amplifier is one of the most important subsystems of modern communication systems. In the case of satellite downlinks, the power efficiency of high-power amplifiers (HPAs) is important because power requirements directly impact size, weight, and cost of the satellite payload. Because the power efficiency is relatively high when the amplifier is operated near the saturation region, as may be the case for satellite links, the HPA frequently must be operated in such a region. However, the nonlinearity of the amplifier in the near saturation region may introduce considerable distortion in the signal to be amplified. As the output power back off is reduced, the signal to distortion power ratio at the amplifier output is correspondingly reduced. This may place a significant restriction on the amount of back off that needs to be introduced, resulting in a loss of the available output power and, equally important, a reduced power conversion efficiency. This results in an increased demand on D.C. power which, in cases where power is supplied by solar panels, may negatively impact the size, weight, and cost of the satellite payload. Schemes by which the amplifier output back off may be minimized while at the same time mitigating the distortion effects of the amplifier may therefore be desirable. Such mitigation becomes even more important when the amplifier input is comprised of relatively high power signals along with relatively low power signals, as in this case distortion due to the strong signals may result in a very poor signal to distortion power ratio for the weak signals.

Previous techniques to mitigate the amplifier distortion effects generally fall into two categories. In the first category may be techniques that attempt to cancel the nonlinear term arising due to the power amplifier in a feedforward or feedback mode with the compensation operation at radio frequency (RF). The feedforward linearizer consists of two loops. The first loop subtracts samples of the input signal from samples of the amplifier output signal to produce samples of the main amplifier's distortion. The second loop subtracts the amplified sampled distortion from the delayed version of the main amplifier output to obtain the final linearized output. This arrangement is complex to implement, requires a second amplifier that needs to be linear to avoid generating its own distortion terms, and results in power loss due to signal combining at the amplifier output. In the feedback linearizer, the amplifier's input and output are detected and low pass filtered and the resulting baseband signals are compared. The error signal is used to control the gain of the amplifier so as to minimize the distortion. This technique suffers from the bandwidth limitation on the amplifier input signal, as the feedback system may respond to frequencies that are much smaller than the inverse of the delay introduced by the amplifier and associated feedback circuitry; thus, the technique is limited to relatively narrowband signals.

In the predistortion linearization technique, the amplifier input is predistorted such that the overall distortion due to the linearizer and amplifier is minimized. The linearizer gain and phase is obtained iteratively for different input power levels. A digital signal processor (DSP) version of the Cartesian predistortion scheme has been proposed wherein a look up table storing inphase and quadrature components of the linearizer as a function of the input signal envelope is used for predistortion for a set of input signal envelope values. The signal to be amplified is digitized and sampled values of the signal are modified by interpolated value of the stored inphase and quadrature components of the linearizer. The correction is limited by interpolation errors. In a proposed adaptive version of the DSP Cartesian predistortion scheme, the stored values are updated according to the amplifier output signal, which is also limited due to the interpolation errors. Based on the feedback architecture of this scheme, a power amplifier linearizer for a time division duplex system has been proposed wherein a receiving subsystem is shared between the receiver and the power amplifier feedback subsystem, resulting in some reduction of complexity for the time division duplex system.

SUMMARY

Methods for pre-processing a signal prior to receipt of the signal by a non-linear device (NLD) to compensate for AM-AM distortion and AM-PM distortion of the signal by the NLD are disclosed. In one embodiment, the method includes: generating a modified amplitude $r_k$ based on an amplitude $x_k$ derived from a digitized envelope $R_{i,k}$ of the signal; generating a scale factor $c_k$ based on the modified amplitude $r_k$ and the amplitude $x_k$; generating an AM-AM compensated signal based on the scale factor $c_k$; generating a first AM-PM phase compensation value based on the modified amplitude $r_k$; and generating an AM-AM and AM-PM compensated signal by modifying a phase of the AM-AM compensated signal based on the first AM-PM phase compensation value. In another embodiment, the method includes: compensating, by at least one processor, an AM-AM distortion of the signal based on a scale factor $$\frac{r_k}{x_k}.$$

$x_k$ is an amplitude derived from a digitized envelope $R_{i,k}$ of the signal, and $r_k$ is a modified amplitude determined by a function $B(x_k)$. $B$ is a polynomial function of degree $N_a$ and an inverse function of an amplitude transfer function $h$ of the NLD. The method further includes compensating, by at least one processor, an AM-PM distortion of the signal based on a first AM-PM phase compensation value determined by a function $\phi(r_k)$. $\phi$ is a polynomial of degree $n_p$ approximating the amplitude to phase transfer function of the NLD about a nominal operating amplitude $A_{0,n}$ of $r_k$.

Also disclosed is a system that, in one embodiment, includes a non-linear electronic signal processing device for processing an input signal, and a pre-processor in communication with the non-linear electronic signal processing device. The non-linear electronic signal processing device has a non-linear transfer function. The pre-processor receives a signal, processes the received signal, and outputs the processed signal to an input of the non-linear electronic signal processing device. The pre-processor includes at least one processor programmed to: generate a modified amplitude $r_k$ based on an amplitude $x_k$ derived from a digitized envelope $R_{i,k}$ of the signal; generate a scale factor $c_k$ based on the modified amplitude $r_k$ and the amplitude $x_k$; generate an AM-AM compensated signal based on the scale factor $c_k$, to generate a first AM-PM phase compensation value based on the modified amplitude $r_k$; and generate an AM-AM and AM-PM compensated signal by modifying a phase of the AM-AM compensated signal based on the first AM-PM phase compensation value.

DESCRIPTION OF THE FIGURES

Various embodiments of the present invention are described here by way of example in conjunction with the following figures, wherein.

DESCRIPTION

Figure 1:
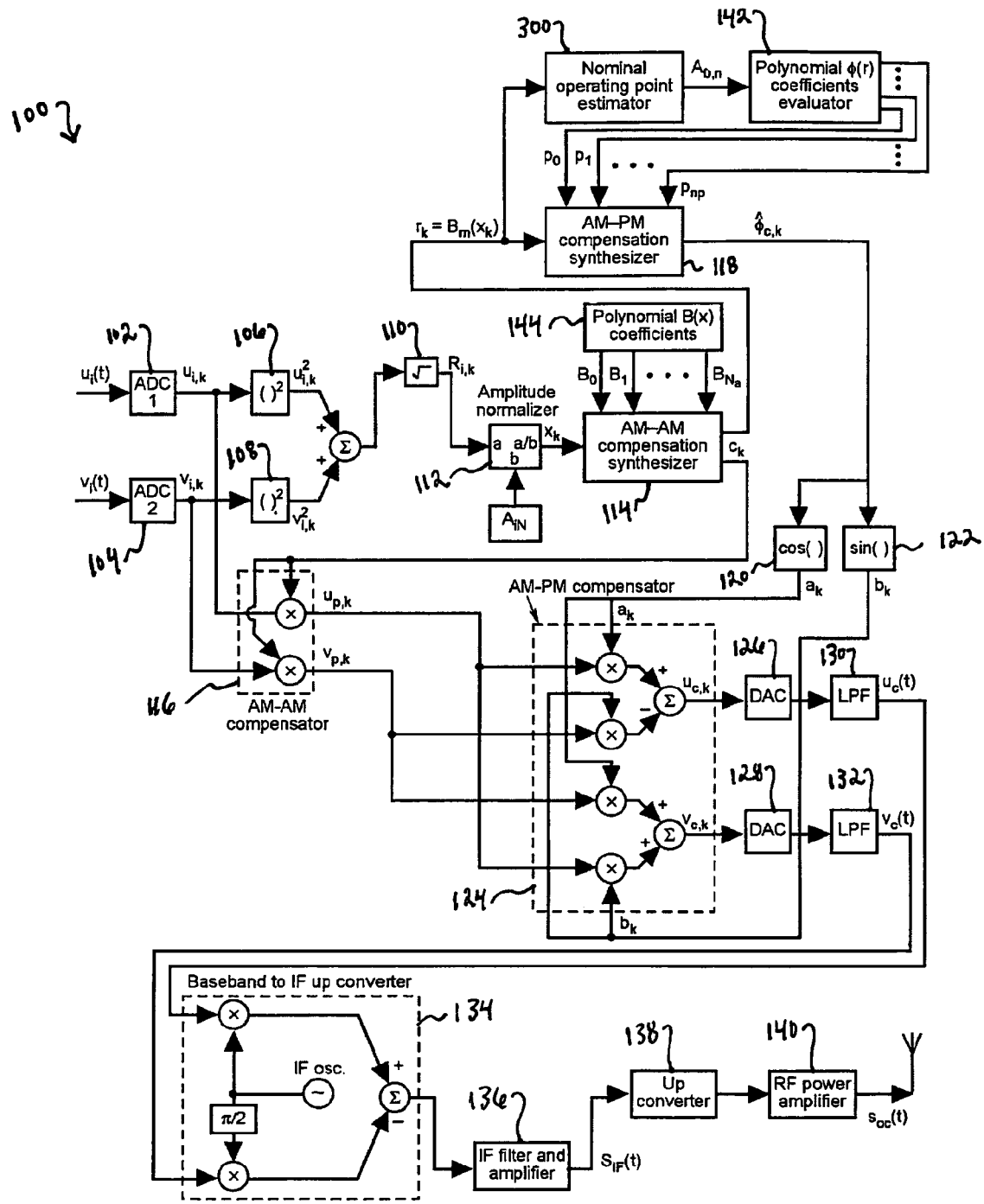
FIGS. 1, 7 and 8 illustrate adaptive compensation systems according to various embodiments.

Embodiments of the present application are directed to a number of polar predistortion-based linearization architectures wherein the gain and phase may be individually compensated. In many cases, phase distortion is more important than gain distortion and may be substantially or completely eliminated by architectures presented herein. In certain architectures presented herein, the linearizer gain function may be represented by a polynomial of odd degree having coefficients obtained by an explicit minimization of the mean squared error between the actual amplifier output gain response and the ideal response, which may be selected to be linear. The method may also be applied to other selected responses. The minimization may be performed using a gradient algorithm with a power 4 optimization index. Such an approach provides very good response up to the input signal amplitude where the amplifier output is saturated. However, beyond this value of the saturation input, the polynomial-based linearizer may result in an oscillatory response at the amplifier output. To avoid this problem, a modified linearizer may be used wherein the output of the linearizer is clipped to a value equal to the saturation input for any value exceeding the saturation input. This may result in ideal-limiter characteristics for the linearized amplifier. Simulation examples show that a $7^{th}$ or $9^{th}$ degree polynomial provides excellent linearization results. Because the amplifier gain response is selected to be an odd function, only the odd degree terms of the linearizer are non zero. Thus, only 4 or 5 coefficients may need to be stored for the linearization compared to a large array of gain values as suggested by previous methods.

According to various embodiments, the amplitude to phase transfer characteristic of the amplifier may be modeled by a polynomial of the input signal envelope. Typically, a $9^{th}$ or lower degree polynomial may be needed to precisely model the characteristics over the entire range of the input signal envelope. Because the range of input signal may be limited for any given power level, the approximation may be performed by a $2^{nd}$ or $3^{rd}$ degree polynomial about a nominal operating point, resulting in a significant computational advantage which may be important in applications involving very wide band signals which may need to be sampled at relatively high rates. The coefficients of the relatively low degree polynomial may be updated at time intervals over which the nominal input power level of the amplifier is expected to change significantly due to various factors such as channel variations. The architecture may include a method to evaluate and update the nominal power level as well. At every sample time, the expected phase distortion due to the amplifier may be evaluated using a $2^{nd}$ or $3^{rd}$ degree polynomial and pre-compensated for in the AM-PM compensator. Architectures that operate at RF and baseband are presented. Open loop adaptive architectures may adapt with respect to the nominal input power level changes.

In addition, close loop architectures are presented that may also adapt to the (relatively slow) changes in the amplifier characteristics as well. In these architectures, the error signal between the output of the amplifier with the open loop compensation and the ideal response may be modeled by a parametric model such as a polynomial having coefficients adapted to the variations that may occur in the amplifier characteristics and any other component variations. Because these variations may occur over a much larger time scale compared to the time scale of the signal variations, the error model parameters may remain essentially constant. Therefore, generation of the adaptive close loop compensation signal to offset the variations in the characteristics of the amplifier and any other components need not depend upon the instantaneous phase or amplitude error. The adaptive close loop compensation signal may instead be derived from the amplifier input signal amplitude and phase without using instantaneous feedback from the amplifier. Accordingly, the close loop adaptive architecture of the present application does not have a bandwidth limitation that arises in other feedback architectures of the prior art that require instantaneous output feedback.

Also, in contrast to the Cartesian predistortion architecture of the prior art, in the close loop architecture of the present application there may be two distinct compensation signals based on the known amplifier characteristics and the variations in the latter, respectively. Because the second component of the compensation is relatively insignificant compared to the first, the architecture disclosed in the present application may be relatively more robust in terms of stability compared to architectures having a single compensation signal.

Simulations have shown that embodiments of the adaptive compensation system of the present application provide significant performance improvement, even when applied to the AM-AM and AM-PM characteristics of an otherwise state of the art linearized amplifier. It is believed that these embodiments provide a distortion mitigation of a much higher level than is currently available.

In one general aspect, embodiments of the present application are directed to devices and methods for pre-processing a signal prior to receipt of the signal by a non-linear device (NLD) to compensate for AM-AM distortion and AM-PM distortion of the signal by the NLD. AM-AM distortion is caused by a change in a gain of the NLD arising from a change in an input power level of the NLD. AM-PM distortion is caused by a phase shift introduced by the NLD arising from a change in an input power level of the NLD. An NLD that receives an input bandpass signal may comprise only the power amplifier or multiple linear or nonlinear devices such as converters, amplifiers, etc. in a cascaded arrangement. The input bandpass signal may be, for example, a single digitally modulated signal such as an offset quadrature phase-shift keying (OQPSK) signal or the sum of a number of digitally modulated signals. In either case, the combined signal at the input of the NLD may be represented in the following equivalent forms:

The AM-PM form: $s_i(t)=R_i(t)\cos(2\pi f_0 t+\theta_i(t))$ (1)

The inphase and quadrature form: $s_i(t)=u_i(t)\cos(2\pi f_0 t)-v_i(t)\sin(2\pi f_0 t)$ (2)

where $R_i(t)$ and $\theta_i(t)$ are respectively the real envelope and the phase of the bandpass signal $s_i(t)$, and $u_i(t)$ and $v_i(t)$ respectively denote the real inphase and quadrature baseband signals. The frequency $f_0$ may be the RF frequency $f_c$ when the nonlinear device is just the power amplifier or it may be equal to the intermediate frequency (IF) frequency $f_{IF}$ when the NLD is comprised of both the up converter and RF power amplifier. The signal $s_i(t)$ may be available at the complex baseband and is equal to $(u_i(t)+j\,v_i(t))$ with $j=\sqrt{-1}$, in which case the real base band signals $u_i(t)$ and $v_i(t)$ are available directly as the real and imaginary components of $s_i(t)$. As will be appreciated from the discussion that follows, embodiments of the present application may be implemented differently depending on, for example, whether the signal $s_i(t)$ is at the RF/IF frequency or at the complex baseband. The output of the NLD, the last stage of which may be the RF power amplifier, may be represented by:

$s_0(t)=R_0(t)\cos(2\pi f_c t+\theta_i(t)+\phi(t))$ (3)

where the output real envelope $R_0(t)$ and the phase $\phi(t)$ may be obtained in terms of the amplitude transfer characteristics function $h(\ )$ and the amplitude to phase transfer characteristics function $\phi(\ )$. These two functions are directly related to the AM-AM and AM-PM characteristics of the device, which are specified in terms of power levels of the sine wave signal used in the measurements of these characteristics. In terms of the amplitude transfer characteristics function $h(\ )$ and the amplitude to phase transfer characteristics function $\phi(\ )$, the output real envelope $R_0(t)$ and the phase $\phi(t)$ may be represented by:

$R_o(t)=A_{ON}h(x(t));$ (4a)

$\phi(t)=\phi(x(t));\ x(t)=R_i(t)/A_{iN}$ (4b)

In equations (4a) and (4b) $A_{iN}$ and $A_{oN}$ may be appropriate input and output normalization amplitudes. For example, $A_{iN}$ and $A_{oN}$ may be selected such that $A_{iN}=\sqrt{2P_{i,s}}$; $A_{oN}=\sqrt{2P_{o,s}}$ where $P_{o,s}$ denotes the output power at saturation with the sine wave input signal and $P_{i,s}$ denotes the corresponding input power level in watts. However, it will be appreciated that any other convenient normalization may also be used with the corresponding modification in the function $h(\ )$ and $\phi(\ )$. If there are linear devices in the cascade operating at relatively low signal power levels (e.g., bandpass filters), such devices may introduce an amount of frequency dependent phase in the signal which will be added to the phase $\phi(t)$ in equation (3). The effect of such devices on the AM-AM and AM-PM model of the composite device is otherwise assumed to be insignificant.

FIG. 1 shows one embodiment of an adaptive compensator 100 that may be used in cases where the inphase and quadrature baseband signals $u_i(t)$ and $v_i(t)$ are directly available, such as when the compensation is applied at the transmitter or at the baseband processor-type satellite repeaters. The adaptive compensator 100 may be implemented, for example, using a computing device, such as, for example, computing device 2600 discussed below in connection with FIG. 26. As shown in FIG. 1, the signals $u_i(t)$ and $v_i(t)$ are converted into digital form by analog-to-digital converters (ADCs) 102, 104, respectively. In certain applications, such as those using digital processing at the satellite repeaters, the digital signals $u_{i,k}$ and $v_{i,k}$ may be directly available, in which case no additional ADCs may be required. The real envelope $R_{i,k}$ is obtained from the digital signals $u_{i,k}$ and $v_{i,k}$ at blocks 106, 108 and 110 and may be represented by:

$R_{i,k}=\sqrt{[u_{i,k}^2+v_{i,k}^2]}$ (5)

The real envelope $R_{i,k}$ is normalized by the selected normalization amplitude $A_{iN}$ in the amplitude normalization block 112 to obtain the normalized amplitude $x_k$, which may be represented by:

$x_k=R_{i,k}/A_{iN};\ k=0,1,2,\ldots$ (6)

The normalized amplitude $x_k$ may be input to the AM-AM compensation synthesizer 114, which modifies the input $x_k$ by a function $B_m(\ )$ such that when the modified amplitude $r_k=B_m(x_k)$ is input to the amplitude transfer characteristics function $h(\ )$ the output of the amplitude transfer characteristics function $h(\ )$ is close to $x_k$, i.e., $B_m(\ )$ achieves amplitude linearization. The AM-AM compensation synthesizer 114 also outputs the scale factor $c_k$ which is equal to $r_k/x_k$ if $x_k > \epsilon$ for some relatively small positive number $\epsilon$ and is equal to the derivative of $B_m(x)$ at $x=0$ otherwise, so as to avoid any numerical problems incurred in dividing one nearly zero number by another number also close to zero.

The scale factor $c_k$ may be input to the AM-AM compensator 116 where it multiplies the inphase and quadrature baseband signals $u_{i,k}$ and $v_{i,k}$ to generate the AM-AM compensated signals $u_{p,k}$ and $v_{p,k}$, respectively, at the AM-AM compensator 116 output. The modified amplitude $r_k$ at the output of the AM-AM compensation synthesizer 114 in FIG. 1 may be input to the AM-PM compensation synthesizer 118 which generates the negative of the estimate of the phase that will be introduced by the NLD, denoted by $\hat{\phi}_{c,k}$. The phase compensation can be input to trigonometric blocks 120, 122 which compute the cosine and sine, respectively, of the phase, denoted by $a_k$ and $b_k$ respectively, as follows:

$$a_k = \cos(\hat{\phi}_{c,k}); \quad b_k = \sin(\hat{\phi}_{c,k}) \tag{7}$$

When the sampling rate is relatively high, the trigonometric functions may be estimated by the following polynomial type approximations wherein the number of terms is dependent upon the maximum absolute value of $\hat{\phi}_{c,k}$. For $|\hat{\phi}_{c,k}| \leq 0.3$ rad, the following approximation may be used:

$$\cos(\phi) \approx 1 - \phi^2/2; \quad \sin(\phi) = \phi - \phi^3/6 \tag{8}$$

The outputs of the trigonometric blocks 120, 122 ($a_k$ and $b_k$, respectively) may be input to the AM-PM compensator 124 which also receives the AM-AM compensated inphase and quadrature signals $u_{p,k}$ and $v_{p,k}$. The AM-PM compensator 124 may add the phase $\hat{\phi}_{c,k}$ to the phase of the AM-AM compensated complex baseband signal ($u_{p,k} + j\ v_{p,k}$); $j = \sqrt{-1}$ according to the following equations:

$$u_{c,k} = a_k u_{p,k} - b_k v_{p,k} \tag{9a}$$

$$v_{c,k} = a_k v_{p,k} + b_k u_{p,k} \tag{9b}$$

The AM-AM and AM-PM compensated signals $u_{c,k}$ and $v_{c,k}$ may be converted into analog form using digital-to-analog converters (DACs) 126, 128, respectively, and low pass filtered with the low pass filters (LPFs) 130, 132, respectively. The 3 dB bandwidths of the LPFs 130, 132 may be selected to be somewhat higher than the bandwidth of the input baseband signals $u_r(t)$ and $v_r(t)$ to take into account the nonlinear compensation introduced by the AM-AM and AM-PM compensators 116, 124, respectively. The filtered baseband signals may be input to the baseband to IF up converter 134, which up converts the complex baseband signal to the IF frequency. After IF filtering and amplification at the IF frequency at block 136, the IF signal may be up converted to the RF frequency at block 138. The resulting RF signal may then be input to the RF power amplifier 140, the output of which is the desired compensated RF signal $s_{oc}(t)$. It will be appreciated that, in certain embodiments, some or all of the blocks following the LPFs 130, 132 that filter the AM-AM and AM-PM compensated signals $u_{c,k}$ and $v_{c,k}$ may not be a part of the adaptive compensator 100 and may instead comprise the NLD for which AM-AM and AM-PM compensation is provided by the adaptive compensator 100.

In another embodiment, the up conversion from the baseband signal to the IF frequency may be performed in the digital domain. Selecting the IF frequency such that $f_{IF} = (2\kappa + 0.5)f_s$ for some integer $\kappa \geq 1$ with $f_s$ denoting the sampling frequency of the baseband signals $u_{i,k}$ and $v_{i,k}$ in FIG. 1, and delaying the sampling clock (not shown) for the ADC 102 with respect to the sampling clock (not shown) for the ADC 104 in FIG. 1 by $T_s/2$ with the sampling period $T_s = 1/f_s$, the sampled IF signal $s_r(mT_{sH})$ may be represented by:

$$s_r[2mT_{sH}] = (-1)^m u_{c,m};$$

$$s_r[(2m+1)T_{sH}] = -(-1)^m v_{c,m}; \quad m = 0, 1, \ldots \tag{10a}$$

In equation (10a), the sampling interval $T_{sH}$ for the IF signal $s_r$ may be equal to $0.5\ T_s$ in order to satisfy the Nyquist criteria. The expression in equation (10a) may be derived from equation (10b) below for relating the sampled IF signal to the sampled baseband signals $u_{c,k}$ and $v_{c,k}$ when all of the signals are sampled at a rate equal to $2f_s$.

$$s_r(kT_{sH}) = \mathrm{Re}\{[u_{c,k} + jv_{c,k}]\exp[j2\pi f_{IF}kT_{sH}]\}; j = \sqrt{-1}; \\ k = 0, 1, \ldots \tag{10b}$$

Figure 2:
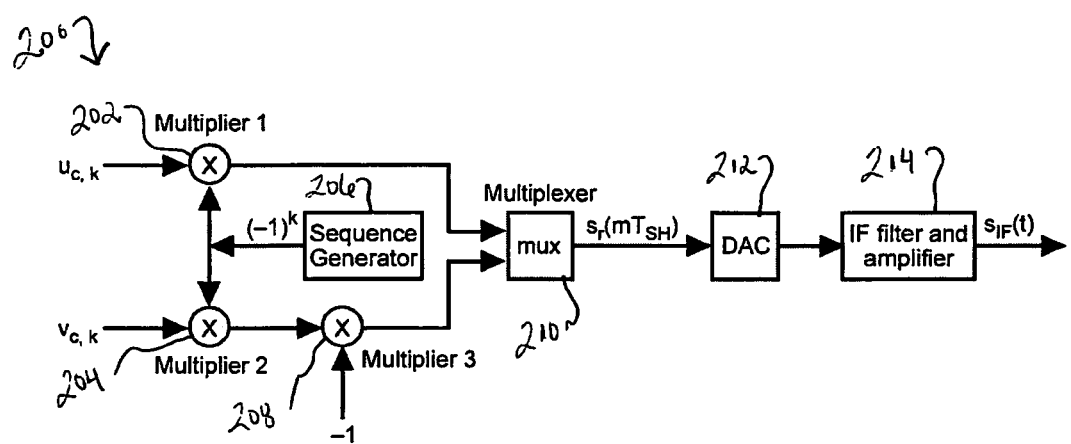
FIG. 2 illustrates a block diagram of a digital baseband to IF converter according to one embodiment.

In equation (10b), Re denotes the operator that takes the real part of its argument. The equation (10a) is obtained from equation (10b) by substitution for $f_{IF}$ and by evaluating the complex exponential function in equation (10b). FIG. 2 illustrates a block diagram of a digital baseband to IF converter 200 according to one embodiment for implementing such a conversion. Referring to FIG. 2, the digital baseband signals $u_{c,k}$ and $v_{c,k}$ at the output of the adaptive compensator 100 in FIG. 1 are input into a pair of multipliers 202, 204 and are multiplied by the sequence $(-1)^k$ output by a sequence generator 206 such that alternate samples of the signals $u_{c,k}$ and $v_{c,k}$ are multiplied by $-1$. The output of multiplier 202 and the inverted output of multiplier 208 are input to a multiplexer 210 that multiplexes the signals from the multipliers 202, 208 into a single multiplexed signal by alternately selecting samples from its inputs. The multiplexer output signal is input to a DAC 212. The output of the DAC 212 is filtered and amplified by an analog BPF/amplifier 214 to generate the IF signal $s_{IF}(t)$. If the selected IF frequency is equal to $f_{IF} = (\kappa + 0.5)f_s$ for some odd integer $\kappa \geq 1$, then the embodiment of FIG. 2 may be modified by deleting the multiplier 208.

Recall that $r_k$ denotes the output of the AM-AM compensation synthesizer and is equal to the real envelope of the signal that is input to the IF filter and amplifier. The amplifier amplitude to phase transfer characteristic function may be modeled by a polynomial of degree $N_p$ over the entire measurement range. Outside the measurement range the phase contributed by the power amplifier, or by the NLD in general, is assumed to have a constant value. The NLD in FIG. 1 may comprise the IF filter and amplifier 136, upconverter 138 and the RF power amplifier 140, wherein generally only the RF power amplifier 140 introduces the nonlinear distortion. In such cases, the amplitude to phase transfer characteristic of the NLD may thus be the same as that of the RF power amplifier 140. The phase introduced by the RF power amplifier 140 or the NLD at time instance k and denoted by $\phi_k$ may be represented by:

$$\phi_k = \begin{cases} g(r_k); & A_l \leq r_k \leq A_h \\ \phi_l; & r_k < A_l \\ \phi_h; & r_k > A_h \end{cases} \tag{11}$$

where $A_l$ and $A_h$ respectively denote the minimum and maximum value of the input amplitude range over which measurements are available, $\phi_l$ and $\phi_h$ denote the phase contribution at these amplitudes, and $g(r_k)$ is a polynomial of degree $N_p$ that may be represented by:

$$g(r_k) = g_0 + g_1 r_k + g_2 r_k^2 + \ldots + g_{N_p} r_k^{N_p} \tag{12}$$

From equation (12) the derivatives of various orders up to some order $N_p$ may be evaluated as:

$$G_1(r) \equiv \frac{dg(r)}{dr} = g_1 + 2g_2 r + 3g_3 r^2 + \ldots + N_p g_{N_p} r^{N_p-1} \quad (13a)$$
$$= G_{1,0} + G_{1,1} r + G_{1,2} r^2 + \ldots + G_{1,N_p-1} r^{N_p-1}$$

$$G_2(r) \equiv \frac{d^2 g(r)}{dr^2} = 2g_2 + 6g_3 r + \ldots + N_p(N_p-1)g_{N_p} r^{N_p-2} \quad (13b)$$
$$= G_{2,0} + G_{2,1} r + G_{2,2} r^2 + \ldots + G_{2,N_p-2} r^{N_p-2}$$

$$\vdots$$

$$G_j(r) \equiv \frac{d^j g(r)}{dr^r} = \frac{j!}{0!}g_j + \frac{(j+1)!}{1!}g_{j+1}r + \ldots + \frac{N_p!}{(N_p-j)!}g_{N_p} r^{N_p-j} \quad (13c)$$
$$= G_{j,0} + G_{j,1} r + G_{j,2} r^2 + \ldots + G_{j,N_p-j} r^{N_p-j}$$

With $G_0(r)$ equal to $g(r)$, the coefficients of various derivative polynomials may thus be represented by:

$$G_{j,i} = \begin{cases} \frac{(j+i)!}{i!} g_{j+i}; & 0 \leq i \leq N_p - j, \; 1 \leq j \leq N_p \\ 0; & \text{otherwise} \end{cases} \quad (14)$$

Figure 3:
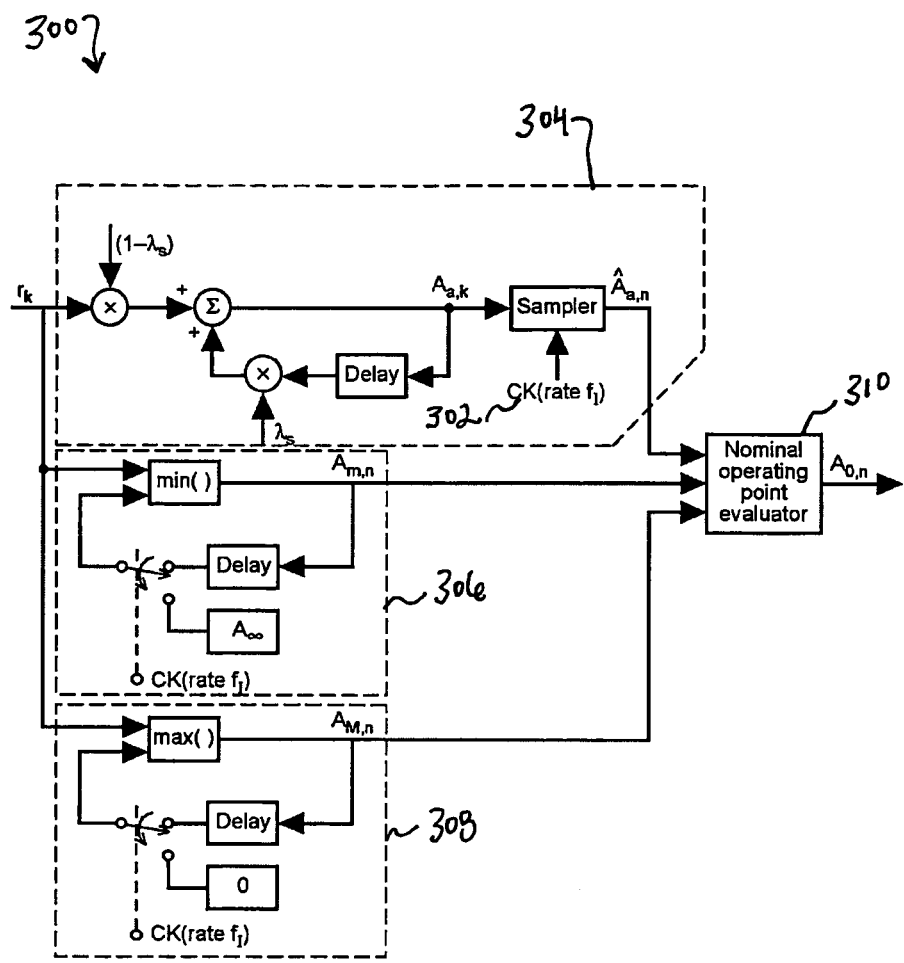
FIG. 3 illustrates a block diagram of a nominal operating point estimator according to one embodiment.

The degree $N_p$ of the polynomial $g(r)$ may be relatively high to be implemented in real time compensation. To minimize the number of arithmetic operations that need to be performed for real time compensation, a lower degree polynomial approximation may be obtained about the nominal operating point determined on the basis of the average of amplitude $r_k$ during any interval of size $T_I$ seconds. The interval $T_I$ may be selected such that the average envelope power at the input to the NLD does not have any significant variation over this period. FIG. 3 shows one embodiment of a nominal operating point estimator 300 with input $r_k$ providing the estimate of the nominal operating point at the end of the $n^{th}$ averaging interval denoted by $A_{0,n}$ at the output. With $\hat{A}_{a,n}$ denoting the estimate of the average value of $r_k$ over the $n^{th}$ interval of duration $T_I$ seconds over which the signal power is essentially constant, $\hat{A}_{a,n}$ may be evaluated by the following equations (15)-(18):

$$S_k = \lambda_s S_{k-1} + r_k; \; S_0 = 0; \; k=1, 2, \ldots \quad (15a)$$

$$A_{a,k} = S_k(1-\lambda_s)/(1-\lambda_s^{k+1}); \; k=1, 2, \ldots \quad (15b)$$

or equivalently:

$$A_{a,k} = \lambda_s[(1-\lambda_s^k)/(1-\lambda_s^{k+1})]A_{a,k-1} + [(1-\lambda_s)/(1-\lambda_s^{k+1})]r_k; \; k=1, 2, \ldots \quad (16)$$

with $0 < \lambda_s < 1$. The parameter $\lambda_s$ in equations (15)-(16) determines the averaging interval, which may be approximately equal to $1/(1-\lambda_s)$ samples. With the sampling period equal to $t_s$ (sampling rate $f_s = 1/t_s$), the averaging interval in seconds denoted by $T_I$ may be represented by:

$$T_I \cong t_s/(1-\lambda_s) \quad (17a)$$

Thus for any specified averaging interval, the desired value of $\lambda_s$ may be obtained by:

$$\lambda_s = (1 - t_s/T_I) \quad (17b)$$

In the steady state with $k \gg N_s = 1/(1-\lambda_s)$, the equation (16) may be replaced by the following equation:

$$A_{a,k} = \lambda_s A_{a,k-1} + (1-\lambda_s) r_k \quad (18)$$

The estimates $A_{a,k}$ may be sampled by a rate $f_I = 1/T_I$ sampling clock 302 at the end of $N_s$ sampling intervals, providing the estimates $\hat{A}_{a,n}$ for $n = 0, 1, \ldots$. The estimate $\hat{A}_{a,n}$ at the end of the $n^{th}$ averaging interval may thus be represented by:

$$\hat{A}_{a,n} = A_{a,n_0}; \; n_0 = (n+1)N_s - 1; \; n = 0, 1, 2, \ldots \quad (19)$$

In another embodiment, instead of the exponential data weighted averaging performed by equations (16)-(18), an arithmetic average may be performed over consecutive segments of $N_s$ samples, with $N_s$ denoting the integer part of $(T_I/t_s)$, to obtain $\hat{A}_{a,n}$ for $n = 0, 1, 2, \ldots$. As shown in FIG. 3, along with the average value of $r_k$ over the interval of $N_s$ samples as estimated by equations (15)-(19), the estimates of the minimum and maximum values of $r_k$ over the $0^{th}$ interval of $N_s$ samples, denoted by $\hat{A}_{m,0}$ and $\hat{A}_{M,0}$, respectively, may be obtained from equations (20a-c) set forth below. Similar estimates for the $n^{th}$ interval of $N_s$ samples, denoted by $\hat{A}_{m,n}$ and $\hat{A}_{M,n}$, are obtained for $n = 1, 2, \ldots$.

$$A_{m,k} = \min(A_{m,k-1}, r_k); \; A_{m,0} = r_0; \; 0 < k < N_s \quad (20a)$$

$$A_{M,k} = \max(A_{M,k-1}, r_k); \; A_{M,0} = r_0; \; 0 < k < N_s \quad (20b)$$

$$\hat{A}_{m,0} = A_{m,N_s-1}; \; \hat{A}_{M,0} = A_{M,N_s-1} \quad (20c)$$

The embodiment of FIG. 3 shows an implementation of equations (18)-(20), with the output of blocks 304, 306, and 308 corresponding to $\hat{A}_{a,n}$, $\hat{A}_{m,n}$ and $\hat{A}_{M,n}$, respectively. In FIG. 3, $A_\infty$ denotes some large number which is an upper bound on the value of $r_k$. At the end of the $N_s$ samples intervals, the nominal mean value of the amplitude $r_k$ may determined by the nominal operating point evaluator 310 in FIG. 3 as follows:

$$A_{0,n} = \begin{cases} \hat{A}_{a,n}; & \hat{A}_{m,n} \geq A_l \text{ and } \hat{A}_{M,n} \leq A_h \\ 0.5(A_l + \hat{A}_{M,n}); & \hat{A}_{m,n} < A_l \text{ and } \hat{A}_{M,n} \leq A_h \\ 0.5(\hat{A}_{m,n} + A_h); & \hat{A}_{m,n} > A_l \text{ and } \hat{A}_{M,n} > A_h \end{cases} \quad (21)$$

For the purpose of AM-PM compensation, the phase introduced by the amplifier 140 may be modeled by a relatively low degree polynomial of degree $n_p$ around the nominal input amplitude $A_0$ computed from equation (21). In certain embodiments $n_p$ may be in the range of 1 to 3 compared to $N_p$, which may be of the order of 10, where $N_p$ is the degree of a polynomial that models the amplifier amplitude to phase transfer characteristics over the entire range of the amplitudes.

The desired polynomial approximation of the phase due to the amplifier may be represented by:

$$\phi(r) = \quad (22)$$
$$p_0 + p_1(r - A_0) + p_2(r - A_0)^2 + \ldots + p_{n_p}(r - A_0)^{n_p} \equiv p(r - A_0)$$

where the suffix n on A has been dropped for convenience. The coefficients of the polynomial $p(r)$ may be computed in the polynomial $\phi(r)$ coefficients evaluator 142 from the polynomial $G_j(r)$ specified by equations (13)-(14), as in equations (23)-(24) below:

$$p_j = \frac{1}{j!} \frac{dg^j(r)}{dr^j}\bigg|_{r=A_0}; j = 0, 1, \ldots, n_p \qquad (23)$$

$$p_j = \frac{1}{j!} G_j(A_0); j = 0, 1, \ldots, n_p \qquad (24)$$

The polynomial functions $G_j(A_0)$ may be evaluated from their coefficients given by equation (14). Denoting by $C_s$ the time in terms of the number of samples it takes to compute the coefficients $p_j$ from equations (21) and (24), then after the initial ($N_s+C_s$) samples, these coefficients may be kept fixed for a subsequent period of $N_s$ samples and used to evaluate $\phi(r)$ from equation (22) during this period. The processes of averaging given by equations (15)-(20), and those of computing the coefficients $p_j$'s from equations (21) and (24), may be performed concurrently during the consecutive intervals of $N_s$ samples.

Referring to FIG. 1, the nominal operating point $A_0$ estimated by the nominal operating point estimator 300 and the polynomial coefficients $p_0, p_1, \ldots, p_{n_p}$ evaluated by the polynomial $\phi(r)$ coefficients evaluator 142 may be input to the AM-PM compensation synthesizer 118 at the end of each averaging interval of $N_s$ samples. These coefficients may be used by the AM-PM compensation synthesizer 118 for a subsequent period of $N_s$ samples. Over any of the consecutive interval of $N_s$ samples, the phase compensation $\hat{\phi}_{c,k}(r_k)$ required to compensate for the amplifier introduced phase may be computed by the AM-PM compensation synthesizer 118.

Figure 4:
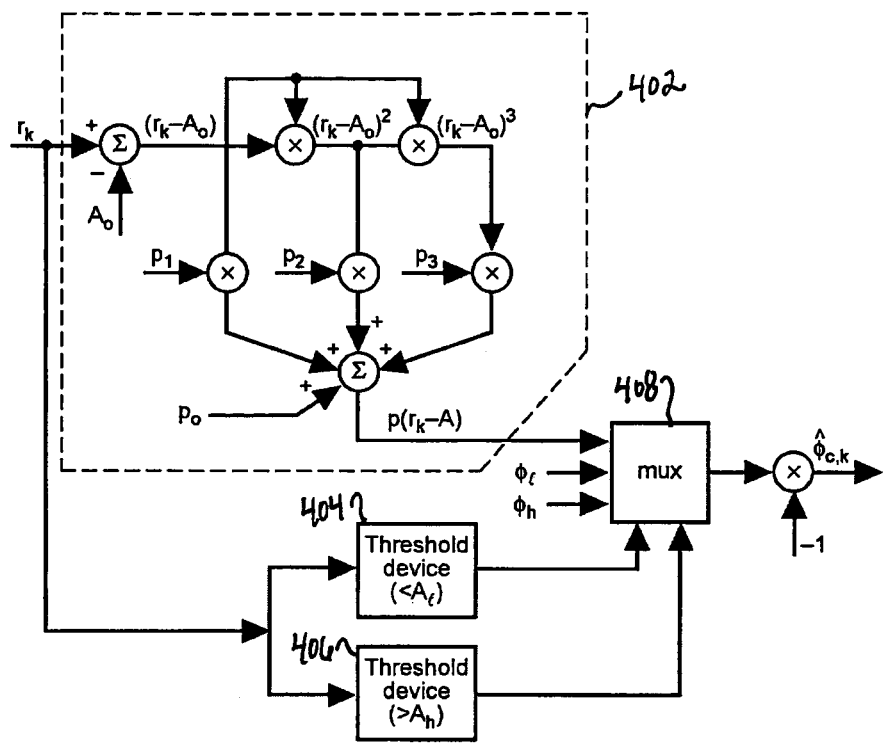
FIG. 4 illustrates a block diagram of an AM-PM compensation synthesizer according to one embodiment.

FIG. 4 shows one embodiment of an AM-PM compensation synthesizer 400. The AM-PM compensation synthesizer 400 may be identical to the AM-PM compensation synthesizer 118 of FIG. 1 in certain embodiments and may determine the phase compensation $\hat{\phi}_{c,k}(r_k)$ in accordance with equation (25) below. The polynomial approximation of the phase due to the amplifier is computed at block 402 and, along with $A_l$, $A_h$, $\phi_l$, $\phi_h$ and the outputs of threshold blocks 404, 406, is input to multiplexer block 408. The output of the multiplexer block 408 is multiplied by −1 to generate the phase compensation $\hat{\phi}_{c,k}(r_k)$. The constants $A_l$, $A_h$, $\phi_l$, and $\phi_h$ may be determined for the NLD according to equation (11).

$$\hat{\phi}_{c,k}(r_k) = \begin{cases} -p(r_k - A_0); & A_l \le r_k \le A_h \\ -\phi_l; & r_k < A_l \\ -\phi_h; & r_k > A_h \end{cases} \qquad (25)$$

In the case of certain linearized amplifiers, the AM-AM is well linearized, however, there may be a significant AM-PM which may significantly degrade the performance of the digital signal at the amplifier output. Thus, only the AM-PM compensation may be adequate. In such cases, the input to the AM-PM compensation synthesizer 400 $r_k$ may be set equal to $x_k$, and $c_k$ at the AM-AM compensation synthesizer 114 may be set equal to 1 in FIG. 1, thus effectively bypassing the AM-AM compensation synthesizer 114.

For applications where both AM-AM and AM-PM are significant, it may be desirable to compensate for both of these distortion effects. Compensation for the AM-AM distortion may be performed by the AM-AM compensation synthesizer 114 and the AM-AM compensator 116 in FIG. 1. Compensation for AM-AM may be implemented using an inverse function such that the cascade of the inverse function and the amplitude transfer characteristic function yields a linear function. Let $h(x)$ denote the amplitude transfer characteristics function of the amplifier 140 so that the output amplitude $y_k = h(x_k)$ with the input signal amplitude equal to $x_k$. Let the inverse function of $h(\ )$ be modeled by a polynomial of degree $N_a$ given by:

$$B(x_k) = B_0 + B_1 x_k + B_2 x_k^2 + \ldots + B_{N_a} x_k^{N_a} \qquad (26)$$

The output amplitude of the cascade of the inverse function and the amplifier 140 may thus be represented by:

$$y_k = h(B(x_k)) \qquad (27)$$

The difference between $y_k$ and $x_k$ is the error $e_k$ which needs to be minimized in the approximation of the inverse function. Selecting the error measure to be $F(e_k)$ for some nonnegative and monotone increasing function $F(e_k)$, for example $F(e_k) = e_k^2$, the minimization problem may then involve the minimization of the following optimization function J with respect to the coefficients of the polynomial $B(x)$, e.g., $$\min J = \int_0^{A_L} F\{h(B(x) - x\} dx \qquad (28)$$

where $A_L$ is appropriately selected from the amplitude transfer characteristic function $h(\ )$. For example, $A_L$ may be set equal to the minimum (normalized) input amplitude for which the amplifier output amplitude is equal to the saturation value $A_s$. To minimize the optimization function J, the partial derivatives of J with respect to $B_j$ for $j=0, 1, \ldots, N_a$ are set equal to 0. The derivative of J with respect to $B_j$ may be represented by:

$$\frac{\partial J}{\partial B_j} = \int_0^{A_L} F'\{h(B(x)) - x\} h'(B(x)) x^j dx \qquad (29)$$

where $F'(\ )$ and $h'(\ )$ denote the derivatives of the functions $F(\ )$ and $h(\ )$ respectively. The derivative of $h(\ )$, when not available in closed form, may be approximated by the first-order difference given in equation (30):

$$h'(y) \cong \frac{h(y + \Delta) - h(y - \Delta)}{2\Delta} \qquad (30)$$

for some relatively small $\Delta$. The integral in equation (29) may also be approximated by a summation as follows:

$$\frac{\partial J}{\partial B_j} \cong \sum_{k=0}^{K-1} 4[h(B(x_k)) - x_k]^3 h'(B(x_k)) x_k^j \delta; x_k = k\delta; \delta = A_L/K \qquad (31)$$

where in the example considered in equation (31) the function $F(e)$ is equal to $e^4$ and K is some sufficiently large integer. The optimum solution for the coefficients of the inverse polynomial $B(x)$ may be obtained by the solution of the following set of equations:

$$\frac{\partial J}{\partial B_j} = 0; j = 0, 1, \ldots (N_a - 1) \qquad (32)$$

The set of equations (32) may be solved by the gradient algorithm:

$$B_{j,k} = B_{j,k-1} - \mu \frac{\partial \mathcal{J}}{\partial B_j}\bigg|_{B_{j,k-1}} ; k = 1, 2, \ldots ; j = 0, 1, \ldots, N_a \quad (33)$$

In equation (33) $B_{j,k}$ denotes the estimate of $B_j$ at the iteration number k, and $\mu$ is some relatively small adaptation parameter. The iteration may terminate when the function $h(B(x))$ provides a suitable linear approximation. The initial estimates for $B_j$ coefficients in equation (33) may be taken equal to:

$$B_{0,0}=1; B_{j,0}=0 \text{ for } j>0 \quad (34)$$

While most appropriate selections of the function F(e) will yield suitable results in terms of the linearization of the amplitude response, simulation examples suggest that a desirable result may be obtained with the following selection for the function F(e):

$$F(e) = e^4 + 0.25e^6 \quad (35)$$

As may be anticipated, while the linearized amplitude response $h(B(x))$ has good linearity over the range of x below the saturation value, it exhibits ripples above the saturation values. Moreover, the power amplifier response by itself may exhibit some ripple effects in the saturation region. The function B(x) obtained by the optimization of J in equation (28) may thus be modified as follows. Denoting by $A_{th}$ the minimum value of the input amplitude x for which $h(B(x))$ is equal to or nearly equal to the amplifier (normalized) output saturation amplitude $A_s$, the compensated response $B_m(x)$ may be modified as follows:

$$B_m(x) = \begin{cases} B(x); & x \leq A_{th} \\ A_p; & x > A_{th} \end{cases} \quad (36)$$

where $A_p$ is the minimum value of x for which $h(A_p) \cong A_s$. The combined response $h(B_m(x))$ may thus be approximately linear over the range $0<x<A_{th}$ and be equal to $A_s$ for $x>A_{th}$, thus in effect obtaining a limiter amplifier. One advantage of this arrangement is an increase in the amplifier output power while at the same time achieving a higher linearization.

To minimize the number of real-time operations, the degree $N_a$ of the polynomial B(x) may be made dependent upon the average input signal $A_a$, and thus, dependent upon the amplifier output back off. As the polynomial B(x) may be an odd degree polynomial, the number of non-zero coefficients may be equal to $(N_a+1)/2$. In certain embodiments, the polynomials corresponding to $N_a=3, 5, 7$ and 9 may be evaluated and stored in memory, and, depending upon the average value $A_a$ or the output back off level, the appropriate coefficients may be used. Alternatively, the highest degree polynomial may be used for all times at the cost of a possible increase in the number of real time computations.

Referring to FIG. 1, the polynomial coefficients $B_0$, $B_1, \ldots, B_{Na}$ may be computed at block 144 and as described above and input to the AM-AM compensation synthesizer 114 which may compute the modified amplitude $r_k = B_m(x_k)$ based on the polynomial B(x). The AM-AM compensation synthesizer 114 may also output the scale factor $c_k$, which is equal to $r_k/x_k$ if $x_k > \epsilon$ for some relatively small positive number $\epsilon$ and otherwise equal to the derivative of $B_m(x)$ at x=0 to avoid any numerical problems incurred in dividing one nearly zero number by another number also close to zero. Referring to FIG. 1, the AM-AM compensator 116 may multiply the inphase and quadrature baseband signals $u_{i,k}$ and $v_{i,k}$ by the scale factor $c_k$ to generate the AM-AM compensated baseband signals $u_{p,k}$ and $v_{p,k}$. The AM-AM compensated baseband signals $u_{p,k}$ and $v_{p,k}$ may be input to the AM-PM compensator 124 for compensating for the AM-PM distortion.

Figure 5:
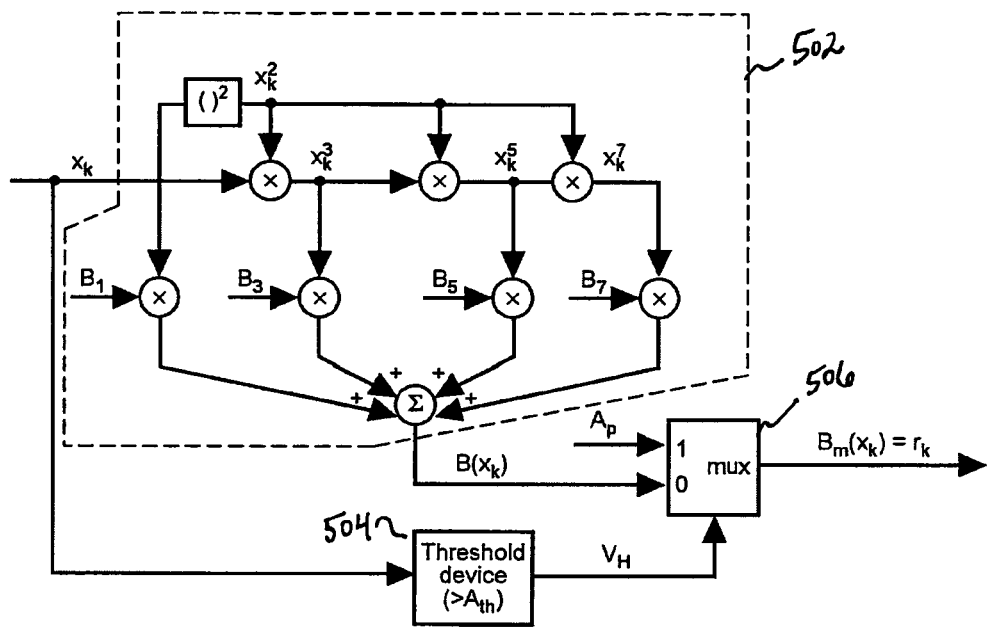
FIG. 5 illustrates a block diagram of an AM-AM compensation synthesizer according to one embodiment.
Figure 5:
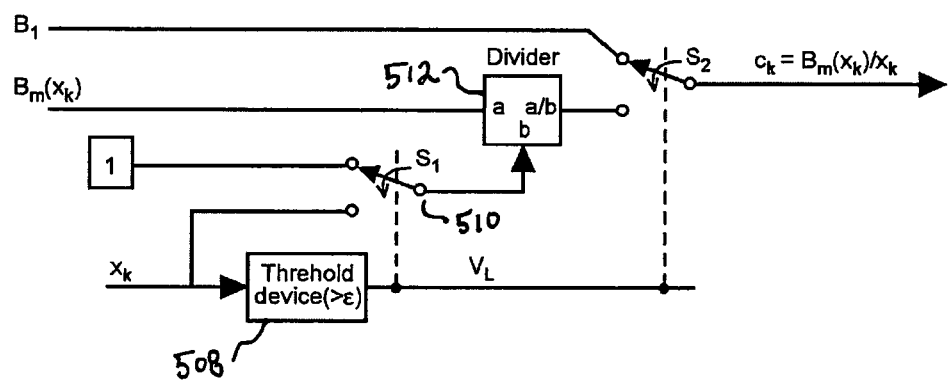

FIG. 5 shows the block diagram of the AM-AM compensation synthesizer 500 according to one embodiment. The AM-AM compensation synthesizer 500 may be identical to the AM-AM compensation synthesizer 114 of FIG. 1 in certain embodiments. Referring to FIG. 5, the polynomial B(x) may computed for the input $x=x_k$ for the example case of $N_a=7$, for example. The order of computation in FIG. 5 requires a total of seven multiplications (block 502) to generate $B(x_k)$. In FIG. 5, the amplitude $x_k$ may be compared with the threshold $A_{th}$ at threshold block 504. The output of the threshold block 504 $V_H$ may be equal to 1 if $x_k > A_{th}$ and be equal to 0 otherwise. Multiplexer block 506 may output $A_p$ if $V_H=1$ and output $B(x_k)$ otherwise. The output $r_k$ may thus equal $B(x_k)$ if $x_k \leq A_{th}$ and equal $A_p$ otherwise. The AM-AM compensation synthesizer 500 of FIG. 5 may also compare $x_k$ with a relatively small positive number $\epsilon$ in threshold block 508, with the output of the threshold block 508 $V_L$ equal to 1 if $x_k \geq \epsilon$ and equal to 0 otherwise. The output of switch $S_1$ 510 may be equal to 1 if $V_L$ is equal to 0 and be equal to $x_k$ otherwise. The output of switch $S_1$ 510 may divide $x_k$ in the divider 512, the output of which is connected to switch $S_2$ 514. The switch $S_2$ 514 output $c_k$ may thus equal $B_1$ if $V_L$ is equal to 0 and equal $B_m(x_k)/x_k$ otherwise. The logic used in the generation of $c_k$ avoids any numerical problems incurred when dividing one nearly zero number by another number also close to zero. Referring to FIG. 1, the output $r_k$ of the AM-AM compensation synthesizer 114 may be input to the AM-PM compensation synthesizer 118, while the output $c_k$ may be input to the AM-AM compensator 116.

In cases in which the signal $s_i(t)$ is at the IF frequency, the signal $s_i(t)$ may be sampled directly to provide the digital inphase and quadrature baseband signals $u_{i,k}$ and $v_{i,k}$. This may be achieved by sampling the IF signal at a rate $F_s$ that is related to $f_{IF}$ such that the samples of $s_i(t)$ relate directly to $u_{i,k}$ and $v_{i,k}$. For example, selection of a sample rate such that $(f_{IF}/F_s)=(2m+1)/4$ for some appropriate integer m provides the desired result as shown below.

With $$s_i(t) = u_i(t)\cos(2\pi f_{IF} t) - v_i(t)\sin(2\pi f_{IF} t) \quad (37)$$

and with $f_{IF} = F_s(2m+1)/4$, $T_F = 1/F_s$, the sample values of the cos and sin terms are given by:

$$\cos(2\pi f_{IF} i T_F) = \cos[\pi i(2m+1)/2] \quad (38a)$$

$$\sin(2\pi f_{IF} i T_F) = \sin[\pi i(2m+1)/2]; i = 0, 1, 2\ldots \quad (38b)$$

with $$\cos(2\pi f_{IF} i T_F) = \cos[\pi k(2m+1)]; i = 2k \quad (39a)$$
$$= \begin{cases} 1; k \text{ even}; i = 0, 4, 8, \ldots \\ -1; k \text{ odd}; i = 2, 6, \ldots \end{cases}$$

$$\cos(2\pi f_{IF} i T_F) = \cos[\pi(2k+1)(2m+1)/2]; i = (2k+1) \quad (39b)$$
$$= 0$$

$$\sin(2\pi f_{IF} i T_F) = \sin[\pi k(2m+1)]; i = 2k \quad (39c)$$
$$= 0$$

-continued $$\sin(2\pi f_{IF} iT_F) = \sin[\pi(2k+1)(2m+1)/2]; i = 2k+1 \quad (39d)$$

$$= \left\{ \begin{array}{l} -1; k \text{ even}; i = 1, 5, \ldots \\ 1; k \text{ odd}; i = 3, 7, \ldots \end{array} \right\}; m \text{ odd}$$

In equation (39d), the sign of the terms is reversed if m is even. Thus, from equations (37)-(39), $s_i(iT_F)=\pm u_i(iT_F)$ for i even and $s_i(kT_F)=\pm(-v_i(kT_F))$ for i odd with alternate signs as per equation (39) with the sign of the first term+ for both the even and the odd terms subsequences for m odd.

Figure 6:
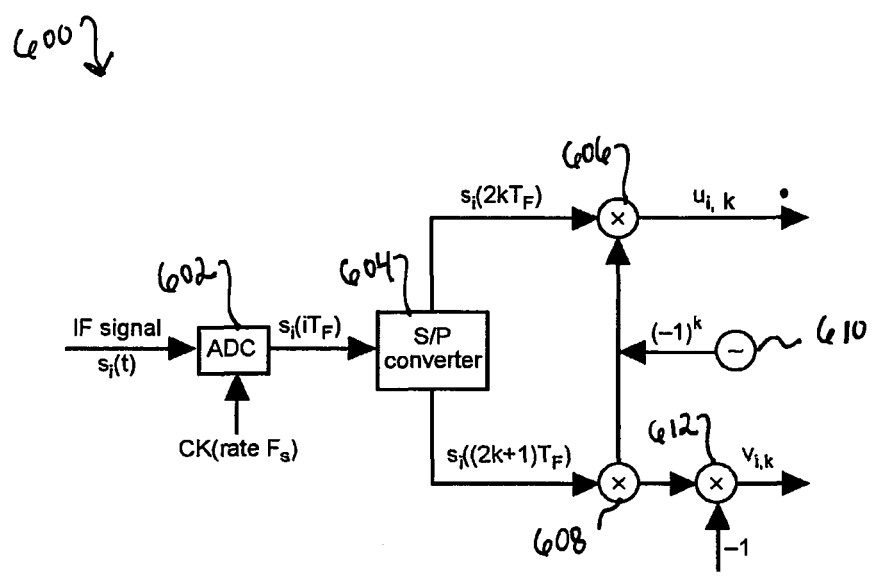
FIG. 6 illustrates a block diagram of a digital IF to complex baseband converter according to one embodiment.

FIG. 6 shows one embodiment of a digital IF to complex baseband converter 600 to obtain the digital inphase and quadrature baseband signals $u_{i,k}$ and $v_{i,k}$. As shown in FIG. 6, the signal $s_i(t)$ may be sampled at a rate $F_s$ such that $(f_{IF}/F_s) = (2m+1)/4$ with m some odd integer. For example, if m=3, then $F_s=(4/7)f_{IF}$ and $f_s=F_s/2$. The sampling rate $f_s$ should also be adequate to satisfy the Nyquist sampling theorem for bandpass signals, e.g., $f_s$ should be greater than or equal to the IF bandwidth. In FIG. 6, the input IF signal $s_i(t)$ is sampled and converted into digital form by an ADC 602 generating $s_i(iT_F)$ at the output. The resulting sampled signal may be input to a serial to parallel converter 604, which splits the digital signal into two streams with even numbered samples in the upper branch and the odd numbered samples in the lower branch in FIG. 6. Both the digital streams may be multiplied by a sequence of alternate +1 and −1 (blocks 606 and 608, respectively) generated by an oscillator 610. The lower stream is then multiplied by −1 at block 612 for the case of odd m. The upper stream then constitutes the sequence $u_{i,k}$, while the lower stream is the sequence $v_{i,k}$. The two signals $u_{i,k}$ and $v_{i,k}$ may be input to the adaptive compensator 100 of FIG. 1, in which case the ADCs 102, 104 for converting the analog baseband signals $u_i(t)$ and $v_i(t)$ into the digital signals $u_{i,k}$ and $v_{i,k}$ are no longer required.

Figure 7:
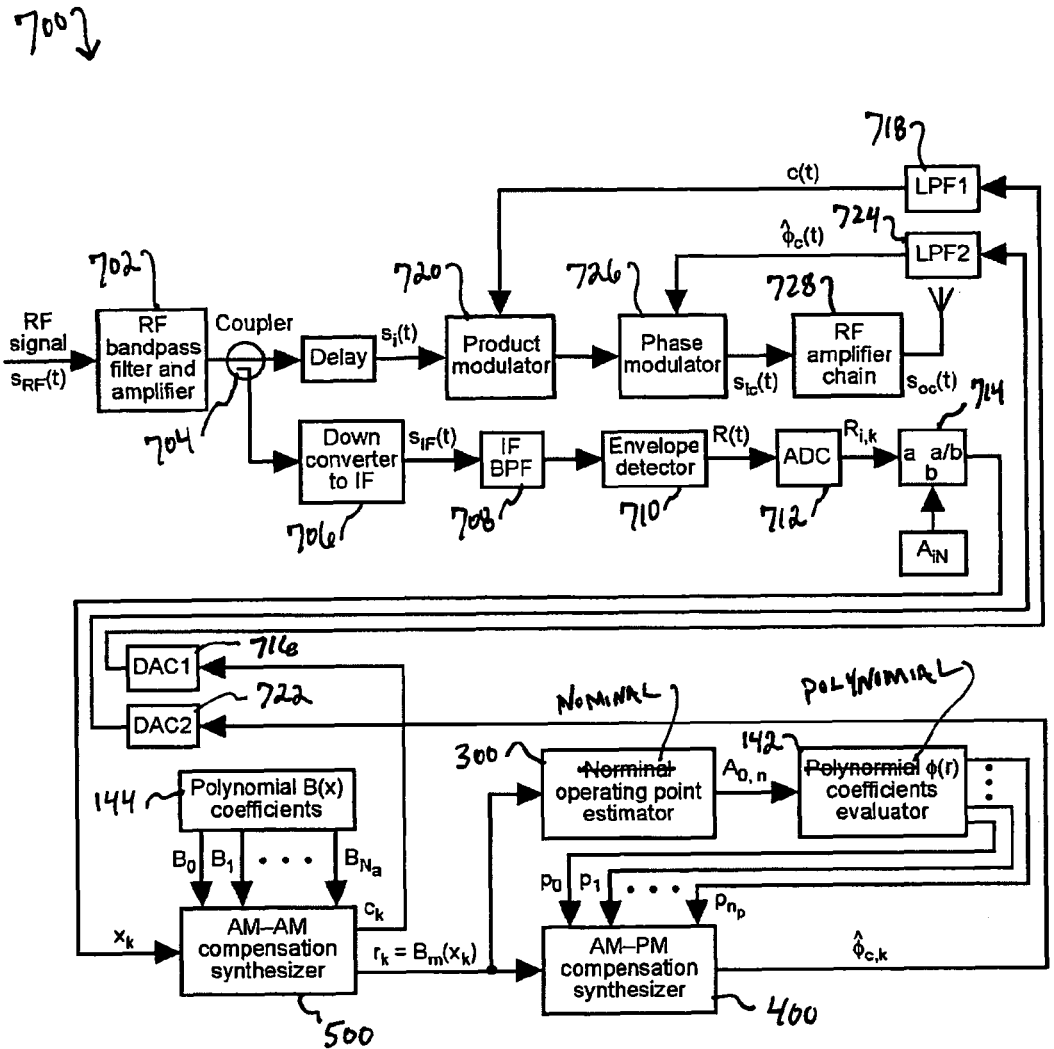

FIG. 7 shows an adaptive compensator 700 according to an alternative embodiment in which the AM-AM and AM-PM compensation may be applied directly at the RF or IF depending upon the specific system configuration and the particular IF and RF frequencies. The adaptive compensator 700 may be implemented, for example, using a computing device, such as, for example, computing device 2600 discussed below in connection with FIG. 26. The arrangement of FIG. 7 may be, for example, that of a bent pipe type satellite. The received RF signal, after filtering and amplification at block 702, may be input to a coupler 704. The coupler 704 may input a small fraction of the power to a down converter 706 and to an IF band pass filter (BPF) 708 for the purpose of synthesizing the compensation signal. The output of the down converter 706 after filtering may be applied to an envelope detector 710. The envelope detector output 710 R(t) may be digitized with ADC 712 to provide the digitized envelope $R_{i,k}$ at the output. In certain embodiments, depending upon the actual frequencies involved, the envelope detector 710 may be implemented by an analog circuit. Alternatively, the envelope detector 710 and ADC 712 may be replaced by a digital IF to complex baseband converter (such as that shown in FIG. 6) to provide the digital complex baseband signals $u_{i,k}$ and $v_{i,k}$, which may be processed according to equation (5) to generate $R_{i,k}$. The digital real envelope signal $R_{i,k}$ may be normalized by the normalization constant $A_{iN}$ at block 714 as in the compensator 700 of FIG. 1 at block 112, except that it will now include the gain of the coupler 704, IF down converter 706 and IF BPF 708, which are the components in the path between the output of the RF BPF/amplifier 702 and the input of the envelope detector 710. The normalized envelope signal $x_k$ may be input to the AM-AM compensation synthesizer 500 to provide a modified envelope signal $r_k$ and the gain $c_k=r_k/x_k$.

Operation of the AM-AM compensation synthesizer 500 of FIG. 7 is shown in FIG. 5 and may be same as that for the system 100 of FIG. 1. The gain signal may be converted into the analog form by a DAC 716 and filtered by a LPF 718 to generate the analog gain signal c(t). The analog gain signal c(t) may be input to the product modulator 720. The product modulator 720 may also be connected to the output of the RF BPF/amplifier 702 via the coupler 704. The signal c(t) amplitude may modulate the RF signal input in the product modulator 720, thus multiplying the real envelope by c(t). The product modulator 720 should have a good linearity in terms of both of its inputs. The other output $r_k$ of the AM-AM compensation synthesizer 500 is input to the AM-PM compensation synthesizer 400 that generates the phase compensation signal $\hat{\phi}_{c,k}$. The operation of the AM-PM compensation synthesizer 400 of FIG. 7 is shown in FIG. 4 and may be the same as that of the AM-PM compensation synthesizer 118 in the system 100 of FIG. 1. The phase compensation signal may be converted into the analog form by a DAC 722 and filtered by a LPF 724 to generate the analog phase compensation signal $\hat{\phi}_c(t)$. The signal $\hat{\phi}_c(t)$ may be input to the phase modulator 726 where it modifies the phase of the RF signal at its input by $\hat{\phi}_c(t)$. Thus, with $s_i(t)$ denoting the RF input to the product modulator 720 and given by equation (40):

$$s_i(t)=R_i(t)\cos(2\pi f_c t+\theta_i(t)) \quad (40)$$

where $f_c$ denotes the carrier frequency of the RF signal, the output of the phase modulator 726 $s_{ic}(t)$ may be represented by:

$$s_{ic}(t)=c(t)R_i(t)\cos(2\pi f_c t+\theta_i(t)+\hat{\phi}_c(t)) \quad (41)$$

The compensated signal $s_{ic}(t)$ is input to the power amplifier chain 728 (which may comprise power amplifier 140) to generate the compensated and amplified signal $s_{oc}(t)$ at the output.

Figure 8:
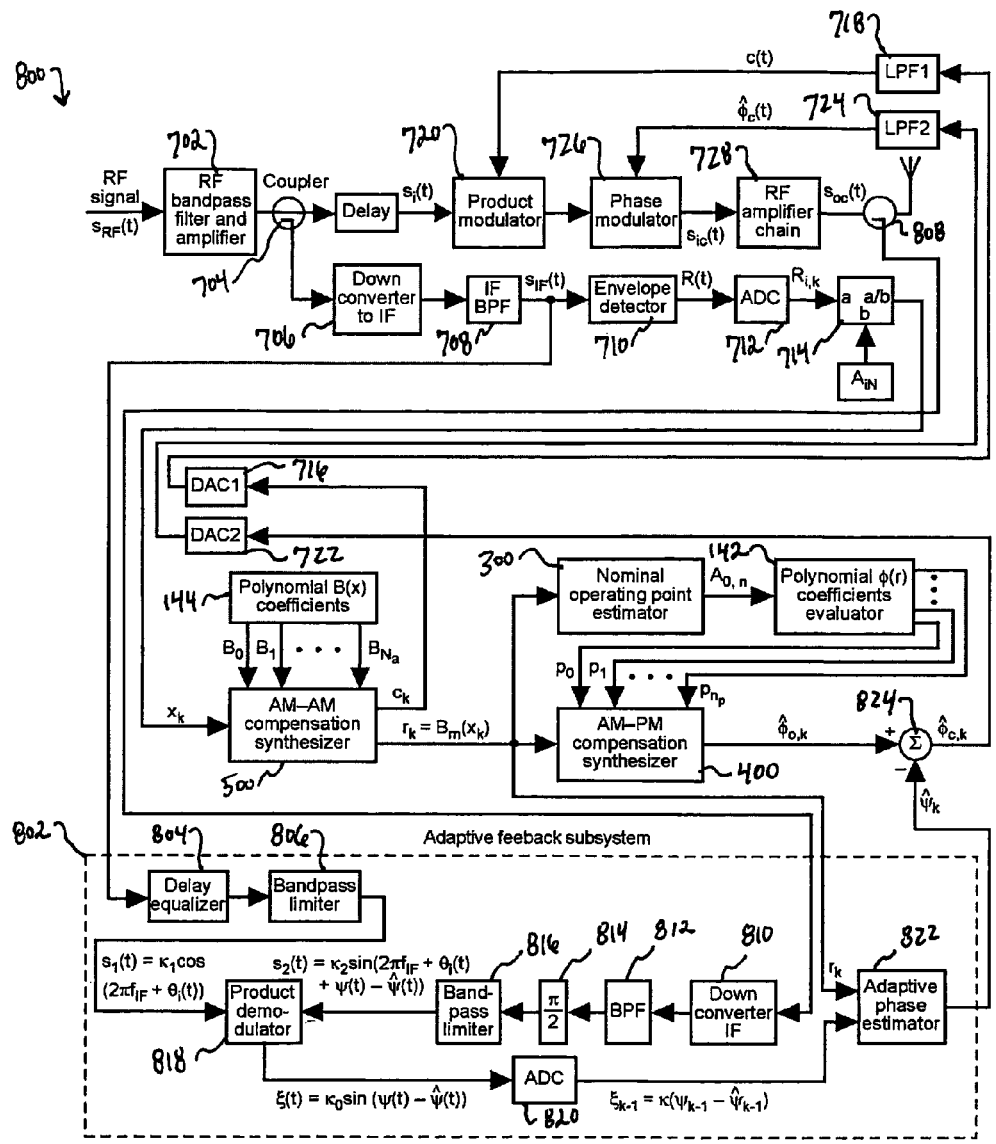

The adaptive compensators 100, 700 of FIGS. 1 and 7 adapt the compensator with respect to the power level variations at the input of the NLD. These variations are measured in terms of the nominal operating point $A_{0,n}$, which is the measure of average power over some selected time segment. However, there may also be variations of the AM-AM and AM-PM characteristics of the NLD that may be caused by variations in the environmental temperature and with aging. In the case of a power amplifier, the variations in AM-AM characteristics may be relatively insignificant while the variations in AM-PM characteristics may be somewhat significant. For a more precise compensation, it may be desirable to take into account such variations. FIG. 8 shows one embodiment of closed loop adaptive compensator 800 that takes such variations into account. The adaptive compensator 800 may be implemented, for example, using a computing device, such as, for example, computing device 2600 discussed below in connection with FIG. 26. The compensator 800 of FIG. 8 may implement adaptation with respect to the variations in the AM-PM characteristics. If required, the adaptation with respect to the variations in the AM-AM characteristics can be similarly included in system FIG. 8.

FIG. 8 shows one embodiment of a closed loop adaptive compensator 800 for the mitigation of the distortion effects of the NLD. One difference between the open loop system of FIG. 7 and the closed loop system of FIG. 8 is the introduction of the adaptive feedback subsystem 802 to the system of FIG. 7. The adaptive feedback subsystem 802 of FIG. 8 measures the difference between the phase of the reference signal $s_{IF}(t)$ and the phase of the signal at the NLD output. The information may be used to offset such a phase difference by a correction signal applied to the amplifier input signal. This correction may be in addition to the phase compensation applied by the open loop system. As shown in FIG. 8, the signal $s_{IF}(t)$, after delay equalization at block 804 to account for the delay incurred in the evaluation of the phase correction signal and the delay introduced by the NLD, may be input to a band pass limiter 806 to eliminate any amplitude variations in the signal. The output of the band pass limiter 806 denoted by $s_1(t)$ may thus be represented by:

$$s_1(t) = \kappa_1 \cos(2\pi f_{IF} t + \theta_i(t)) \quad (42)$$

for some constant $\kappa_1$. The output of the power amplifier chain 728 may be sensed via a coupler 808 and applied to a down converter 810 to shift the spectrum to IF. After filtering by a BPF 812, the output of the down converter 810 may be shifted in phase by $\pi/2$ at block 814. The phase shifted signal may be input to a second band pass limiter 816 having an output $s_2(t)$ represented by:

$$s_2(t) = \kappa_2 \cos(2\pi f_{IF} t + \theta_i(t) + \psi(t) - \hat{\psi}(t)) \quad (43)$$

for some constant $\kappa_2$. In equation (43), $\psi(t)$ may denote the phase error incurred in the open loop adaptation due to variations in temperature etc., and $\hat{\psi}(t)$ may be the feedback due to the adaptive feedback subsystem 802. The output of the second band pass limiter 816 $s_2(t)$ may be input to the product demodulator 818, along with the output of the band pass limiter 806. The output of the product demodulator 818 may be represented by:

$$\xi(t) = \kappa_0 \sin(\psi(t) - \hat{\psi}(t)) \quad (44)$$

for some constant $\kappa_0$. The signal $\xi(t)$ may be digitized by an ADC 820 to generate $\xi_{k-1}$. The phase error $(\psi_{k-1} - \hat{\psi}_{k-1})$ is expected to be relatively small due to the open loop correction already incorporated, and thus the sampled error signal $\xi_{k-1}$ at time $(k-1)$ may be approximated by:

$$\xi_{k-1} = \kappa_0(\psi_{k-1} - \hat{\psi}_{k-1}) \quad (45)$$

The signal $\xi_{k-1}$ and $r_k$ may be input to an adaptive phase estimator 822 to generate the phase estimate $\hat{\psi}_k$, which may then be subtracted from the phase compensation signal $\hat{\phi}_{o,k}$ generated by the open loop compensator 700 at block 824 to create the resultant phase compensation signal $\hat{\phi}_{c,k}$. The resultant phase compensation signal, after being converted into the analog form by the DAC 722 and filtered by the LPF 724, may be applied to the phase modulator 726 to compensate for the phase distortion introduced by the NLD.

Figure 9:
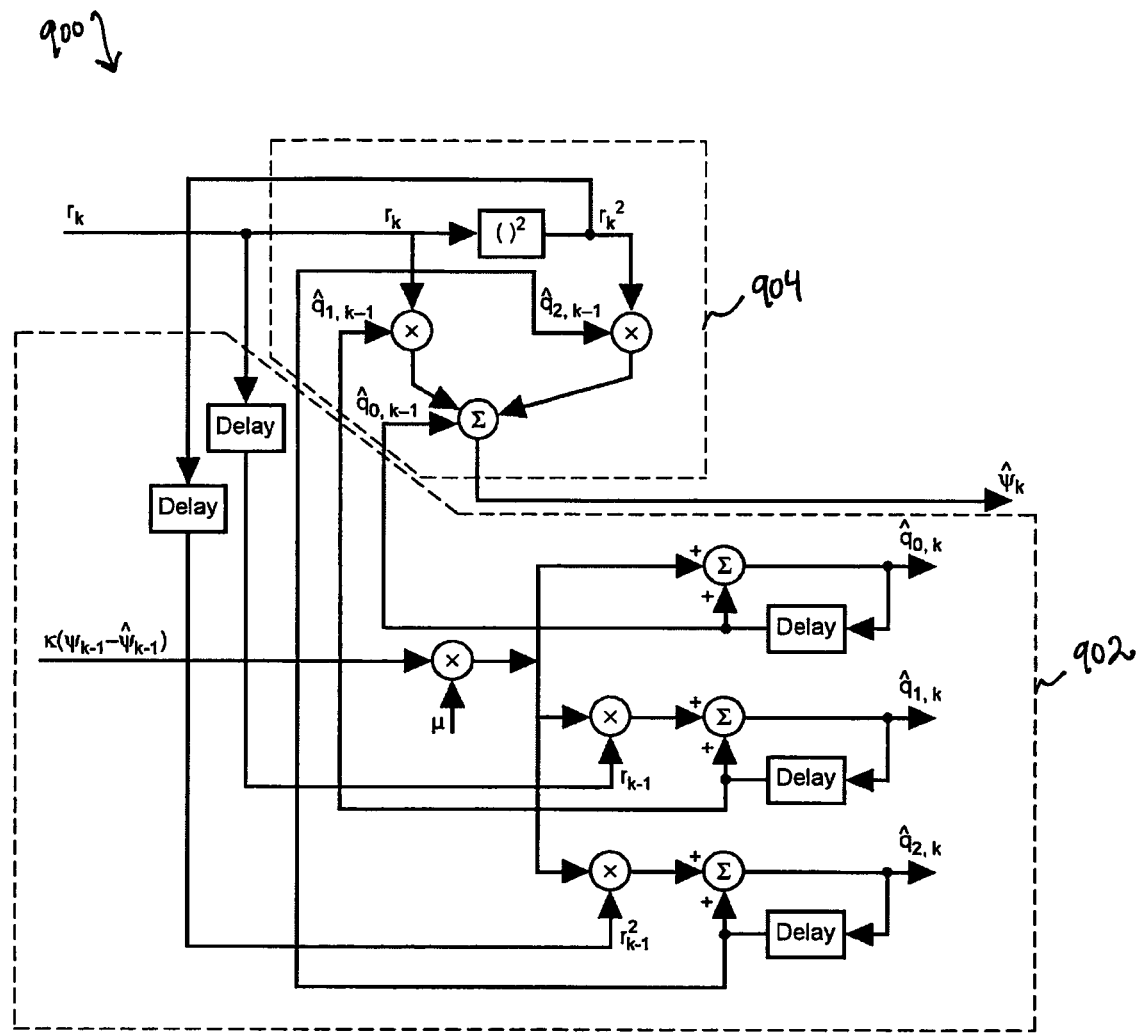
FIG. 9 illustrates a block diagram of an adaptive phase estimator according to one embodiment.

FIG. 9 shows a block diagram of an adaptive phase estimator 900 according to one embodiment. In the adaptive phase estimator 900, the phase distortion $\psi_k$ arising due to the variations in the AM-PM characteristics of the NLD or due to any other unmodeled non-linearity and/or source of distortion may be estimated by a polynomial q( ) of the amplitude $r_k$, wherein the degree of the polynomial q( ) denoted $n_q$ is relatively small. The estimate of $\psi_k$ denoted by $\hat{\psi}_k$ may thus be represented by:

$$\hat{\psi}_k = q_0 + q_1 r_k + q_2 r_k^2 + \ldots + q_{n_q} r_k^{n_q} \quad (46)$$

The polynomial coefficients $q_0, q_1, \ldots, q_{nq}$ may be selected so as to minimize some measure of the error $\epsilon_k = \psi_k - \hat{\psi}_k$. Selecting a quadratic performance measure, the polynomial coefficients may be adaptively estimated using the stochastic gradient algorithm. Thus, $$\hat{q}_{j,k} = \hat{q}_{j,k-1} + \mu \kappa r_{k-1}^j \epsilon_{k-1}; j=0, 1, \ldots, n_q; k=0, 1, 2 \ldots \quad (47)$$

In FIG. 9, the polynomial coefficients are estimated at block 902, and $\hat{\psi}_k$ is determined at block 904. The initial estimate of the polynomial coefficients may be all set to 0. FIG. 9 shows the adaptive phase estimator 900 described by equations (46) and (47) for the example case of $n_q = 2$. As may be inferred from FIG. 9, the inputs to the adaptive phase estimator 900 are $\xi_{k-1} = \kappa(\psi_{k-1} - \hat{\psi}_{k-1})$ and the amplitude signal $r_k$, with $\hat{\psi}_k$ generated at the output. In certain embodiments, only the closed loop AM-PM adaptation may be implemented without the open loop component of the AM-PM adaptation.

The performance of embodiments of the disclosed architecture has been evaluated when applied to compensate for the distortion due to a traveling wave tube amplifier (TWTA) and one of its linearized versions. In the discussion that follows, the performance is presented when the TWTA is described in terms of the Saleh model. Similar results were obtained for the case of an otherwise linearized TWTA. For the Saleh model, the amplitude to phase transfer characteristics function $\phi(r)$ in equation (4) (with r denoting the normalized, and possibly modified due to the AM-AM compensation, input signal real envelope) may be represented by:

$$\phi(r) = \alpha_\phi r^2/(1+\beta_\phi r^2); \alpha_\phi = 2.5293, \beta_\phi = 2.8168 \quad (48)$$

Figure 10:
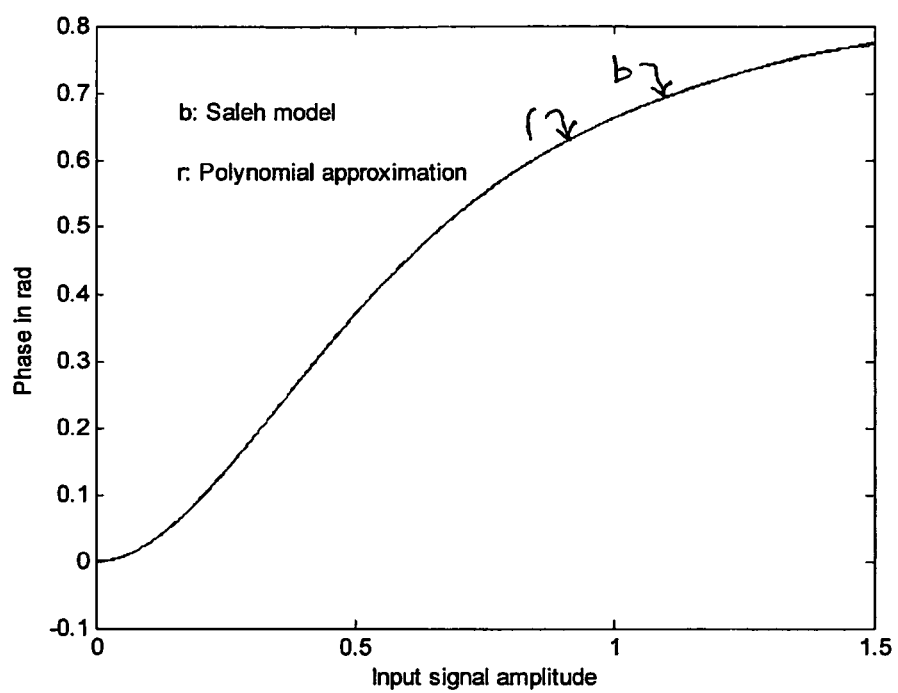
FIG. 10 is a plot of amplitude to phase transfer characteristics of TWTA and its polynomial approximation.

FIG. 10 plots the phase transfer characteristics function $\phi(r)$ versus r for the Saleh model. FIG. 10 also shows the result of approximating the function $\phi(r)$ by a polynomial g(r) (see equation (12)) of degree 5. The polynomial approximation is given by:

$$g(r) = -0.6523 r^5 + 3.015 r^4 - 5.1079 r^3 + 3.4528 r^2 - 0.0454 r - 0.0004 \quad (49)$$

As may be inferred from FIG. 10, the two graphs are very close with the rms approximation error equal to 0.0012 rad.

Figure 11:
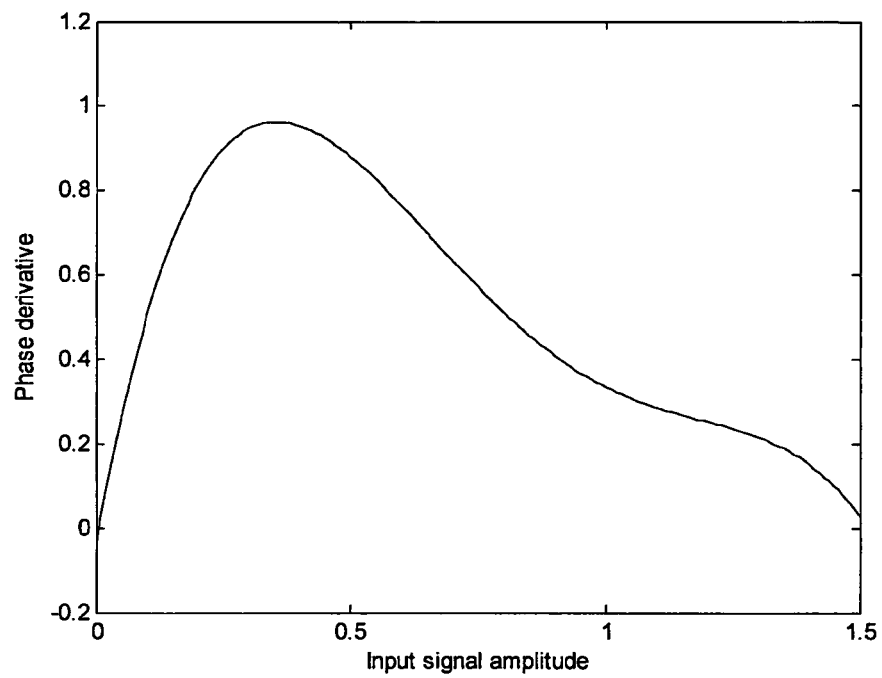
FIGS. 11 and 12 are plots of the first and second order derivatives, respectively, of a polynomial approximation $g(r)$ of the amplitude to phase characteristic.
Figure 12:
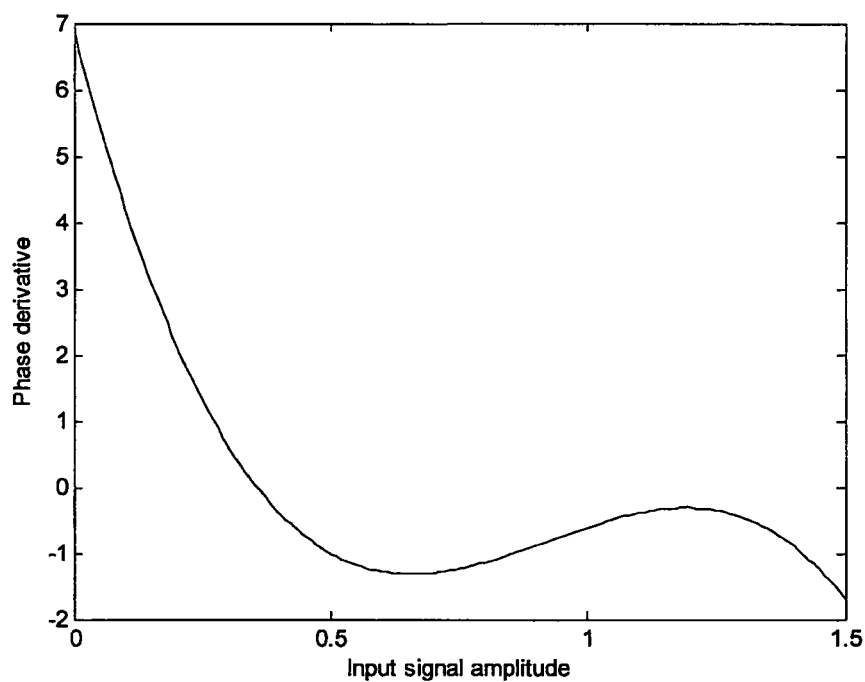
Figure 13:
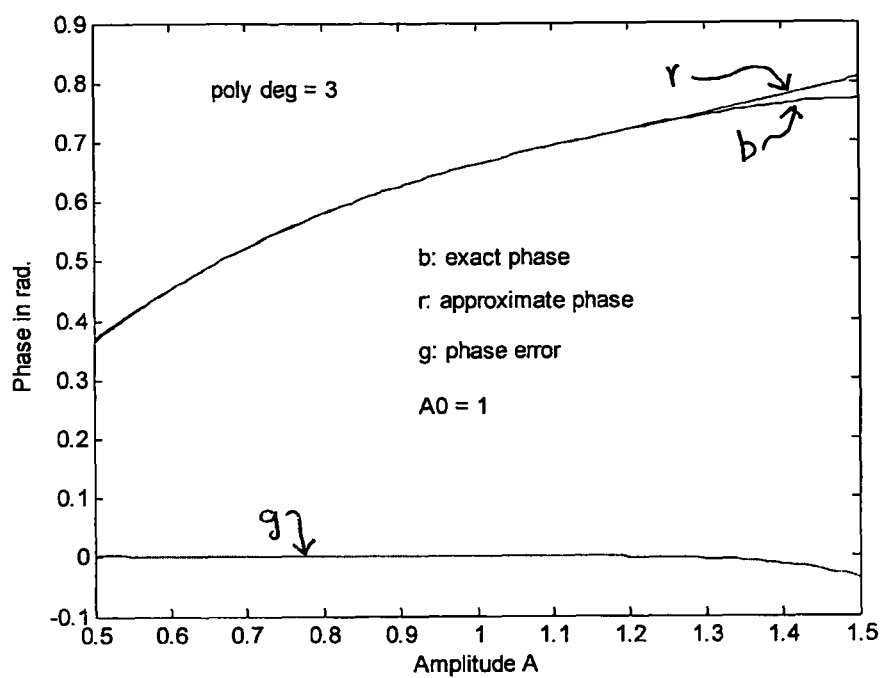
FIG. 13 is a plot of an approximation of the $\phi(r)$ function with a degree 3 polynomial.

FIGS. 11 and 12 plot, as examples, the first and second derivative of the function g(r) denoted by $G_1(r)$ and $G_2(r)$, respectively, and given by equations (13a) and (13b). As described by equations (22)-(24), the function $\phi(r)$ may be approximated by a lower order polynomial about some nominal operating point $A_0$. FIG. 13 plots the result of such an approximation when $A_0 = 1$ and a degree 3 polynomial approximation is used. FIG. 13 also plots the error incurred over the interval [−0.5 1.5] with such an approximation. As may be inferred from FIG. 13, the error is relatively small over the interval. The degree 3 polynomial approximation from equations (22)-(24) may be represented by:

$$p(r-A_0) = 0.4296(r-A_0)^3 - 0.3035(r-A_0)^2 + 0.3351(r-A_0) + 0.6618 \quad (50)$$

Figure 14:
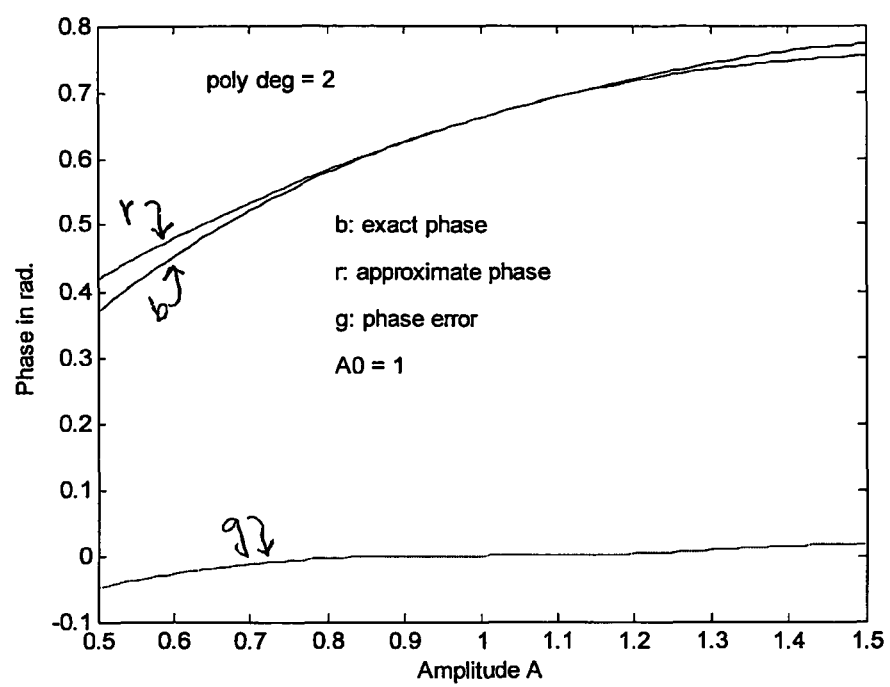
FIG. 14 is a plot of an approximation of the $\phi(r)$ function with a degree 2 polynomial.

FIG. 14 plots the corresponding result with a degree 2 polynomial given by $$p(r-A_0) = -0.3035(r-A_0)^2 + 0.3351(r-A_0) + 0.6618 \quad (51)$$

As may be inferred from FIG. 14, the error of approximation remains relatively small even with degree 2 polynomial. This is desirable as the real time correction is made at the sampling rate $f_s$, while the coefficients of the polynomial $p(r-A_0)$ need to be updated only once in the interval of $N_s$ samples. In most applications, $N_s$ is relatively very large number.

The amplitude transfer characteristics function h(x) in equation (4) for the Saleh model may be represented by:

$$h(x) = \alpha_a x/(1+\beta_a x^2); \alpha_a = 1.9638, \beta_a = 0.9945 \quad (52)$$

Figure 15:
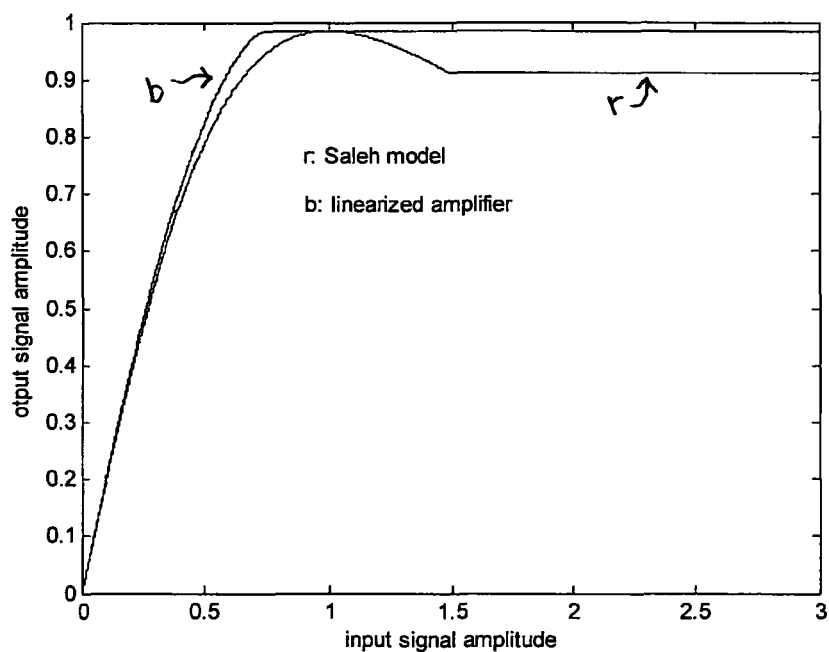
FIG. 15 illustrates plots of an amplitude transfer characteristics for a Saleh model and an amplitude transfer characteristic compensated by a degree 7 polynomial.

The AM-AM distortion is compensated by a function $B_m(x)$ of equation (36) where the polynomial B(x) may be an odd degree polynomial obtained by the iterative optimization described by equations (28)-(35). The parameter $A_p$ in equation (36) depends upon the degree of polynomial B(x) selected for optimization. FIG. 15 plots the amplitude transfer characteristics function h(x) given by equation (52). FIG. 15 also shows the result with the distortion compensation when the degree of the polynomial B(x) is 7 with 4 nonzero terms. The polynomial B(x) for this case may be represented by:

$$B(x)=0.7612x^7+0.2532x^5+0.0835x^3+1.0292x \quad (53)$$

The parameter $A_p$ for this case is equal to 0.763.

Figure 16:
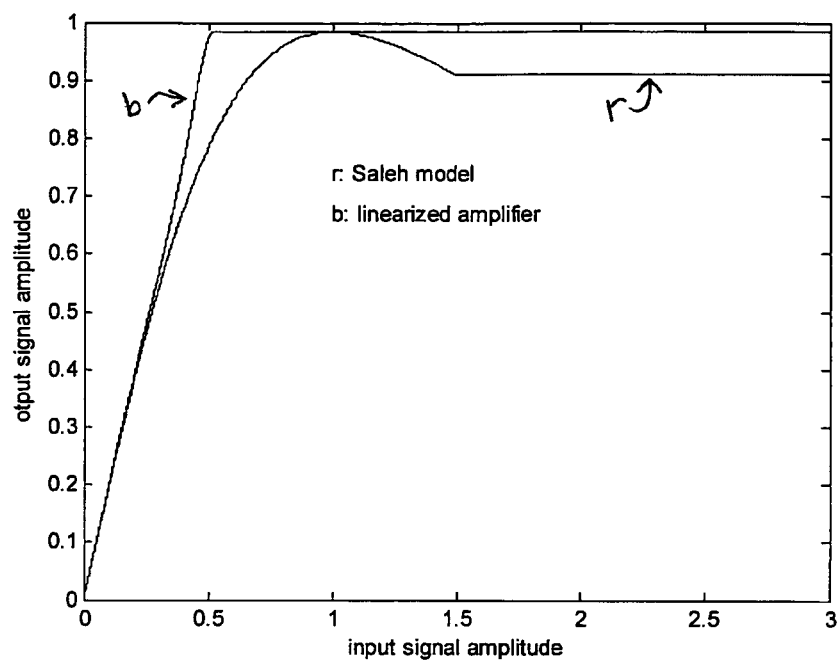
FIG. 16 illustrates plots of an amplitude transfer characteristics for a Saleh model and an amplitude transfer characteristic compensated by a degree 9 polynomial.

FIG. 16 shows the result of compensation with a degree 9 odd polynomial with 5 non-zero coefficients. The parameter $A_p$ for this case is equal to 0.518 and the polynomial B(x) may be represented by:

$$B(x)=106.9x^9+12.05x^7+1.357x^5+0.1527x^3+1.0168x \quad (54)$$

As may be inferred from FIG. 16, for an operating point near saturation, the compensation provides a significantly higher output power compared to that obtained without any compensation. It is to be noted that even with a relatively large coefficient of degree 9 term, the contribution due to this term is relatively small over the range of x between 0 and $A_p$=0.518 where the polynomial B(x) is computed.

The performance of the compensation system may be evaluated when the input to the amplifier is the sum of a wideband signal and a narrow band signal, wherein both the signals are digitally modulated signals with OQPSK modulation. In the simulation example, both the signals are filtered by square-root raised cosine filters. The WB signal has a rate $R_{s1}$=100 Msps with the square-root raised cosine filter roll-off factor $\alpha_1$ equal to 0.3. The narrowband (NB) signal with rate $R_{s2}$=4.44 Msps has the filter roll-off factor $\alpha_2$=0.21. The separation between the center frequencies of the two signals $\Delta f_c$ is equal to 68.12 MHz, thus avoiding any overlap among their spectrums. Both the signals have the same peak power spectral densities. The ratio of the power levels of the two signals is 22.5 or 13.52 dB. The performance may be obtained in terms of the probability of bit error for the two signals in the presence of the distortion introduced by the amplifier and the receiver thermal noise. The results may be obtained for various values of the output power back off in dB relative to the maximum possible power level at the amplifier input with a tone signal input. Due to the nature of the band limited digital signals, the minimum achievable output power back off is strictly greater than zero.

Figure 17:
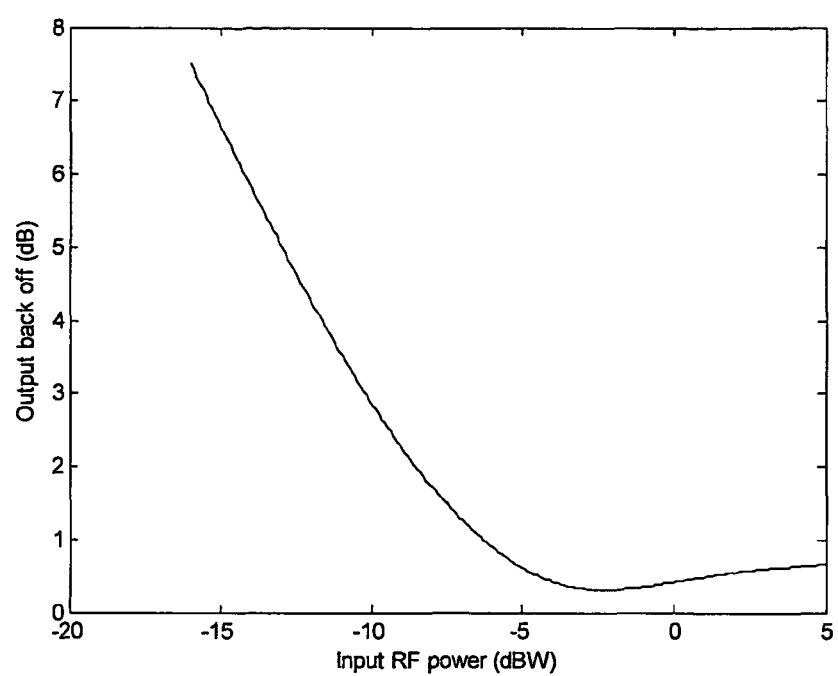
FIG. 17 is a plot of amplifier output back off as a function of RF input signal power with the sum of two OQPSK signals at the amplifier input.

FIG. 17 plots the amplifier output back off in dB versus the input signal power level when the signal is the sum of two OQPSK signals described above obtained by simulation. The graph of FIG. 17 may then be used to determine the required input power level for any specified output back off.

Figure 18:
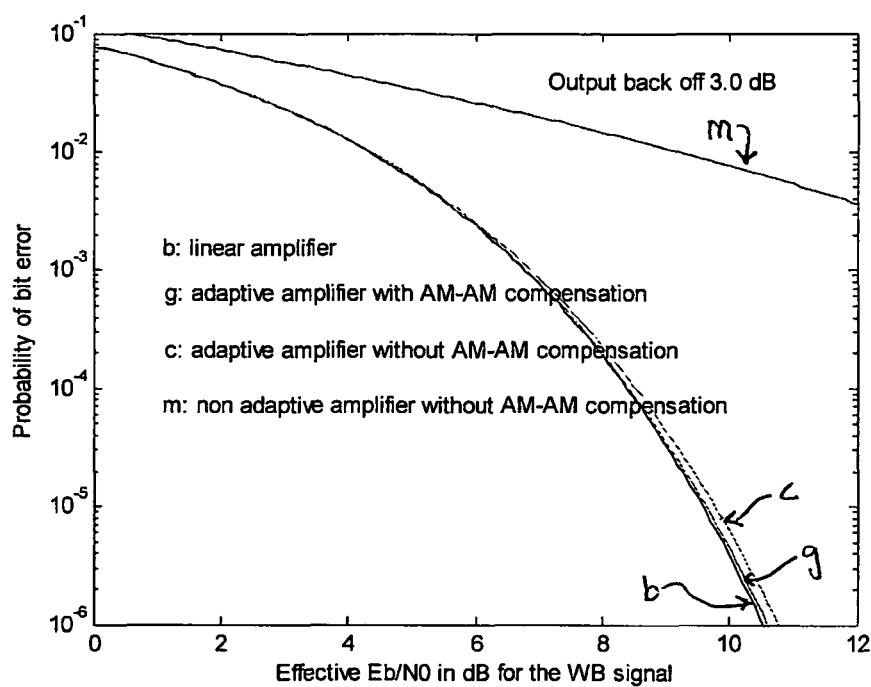
FIG. 18 illustrates plots of probability of bit error $P_e$ for the WB signal versus $(E_b/N_0)_{WB}$ with and without compensation for an output back off of 3 dB.

FIG. 18 plots the probability of bit error $P_e$ for the WB signal versus the effective $(E_b/N_0)$ for the wide band signal, denoted by $(E_b/N_0)_{WB}$ and defined by:

$$(E_b/N_0)_{WB}=(E_b/N_0)_T-P_{L1}; (E_b/N_0)_T=10 \log_{10}[0.5P_T T_{s1}/N_0] \quad (55)$$

where $P_T$ is the total power at the receiver input, $T_{s1}=1/R_{s1}$ is the symbol period for the WB signal, and $P_{L1}$ is the power sharing loss for the WB signal defined by:

$$P_{L1}(dB)=-10 \log \{R_{s1}/[R_{s1}+10^{\Delta P_0/10}R_{s2}]\} \quad (56)$$

In equation (56), $\Delta \Pi_0$ is the difference between the peak power spectral densities of the NB and WB signals. For the simulation example $\Delta \Pi_0$=0 dB and $P_{L1}$=0.19 dB. The effective $(E_b/N_0)$ for the narrow band signal denoted by $(E_b/N_0)_{NB}$ is similarly defined by:

$$(E_b/N_0)_{NB}=(E_b/N_0)_T-P_{L1}+\Delta P_0 \quad (57)$$

The bit energy to noise spectral density ratio $(E_b/N_0)_{NB}$ will be equal to the actual $(E_b/N_0)$ for the NB signal if the amplifier were linear. For the case of nonlinear amplifier considered here, the two will be different; however, $(E_b/N_0)_{NB}$ is still a convenient parameter to be used for comparison. For the case of $\Delta \Pi_0$=0 dB, $(E_b/N_0)_{NB}=(E_b/N_0)_{WB}$ from equations (55) and (57).

FIG. 18 plots the probability of bit error $P_e$ for the WB signal versus $(E_b/N_0)_{WB}$ for the case of no compensation, with only AM-PM compensation, and with both AM-AM and AM-PM compensation. For reference, FIG. 18 also plots the result for the case of a linear amplifier with no distortion. As may be inferred from FIG. 18, there is a drastic performance improvement with the AM-PM compensation, with the performance being close to the ideal case of the linear amplifier. For example, for a $P_e=10^{-2}$, the improvement is about 5 dB. In this case the additional improvement due to the AM-AM compensation is only marginal, as with this level of back off the amplifier behaves linearly in terms of amplitude transfer characteristics.

Figure 19:
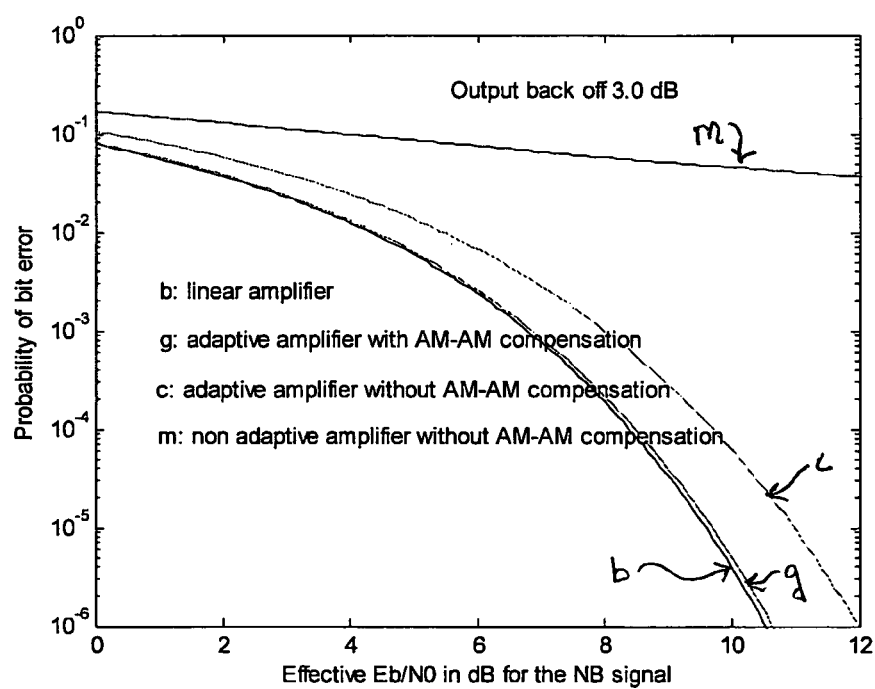
FIG. 19 illustrates plots of probability of bit error $P_e$ for the NB signal versus $(E_b/N_0)_{NB}$ with and without compensation for an output back off of 3 dB.

FIG. 19 plots the corresponding result for the probability of bit error $P_e$ for the NB signal versus $(E_b/N_0)_{NB}$. In this case there is a significant improvement of about 1.4 dB due to AM-AM compensation over that due to AM-PM compensation alone. The performance when both AM-AM and AM-PM compensation are used is very close to that for the ideal linear amplifier case. As expected, the performance without any compensation is very poor. The degree $N_a$ of the odd polynomial B(x) is equal to 9, which results in about 1.1 dB increase in the output power with the same input power level due to the AM-AM compensation, thus in effect reducing the input power level for the same 3 dB output back off. The result for the case of $N_a$=7 provides marginally higher $P_e$ compared to that for $N_a$=9.

Figure 20:
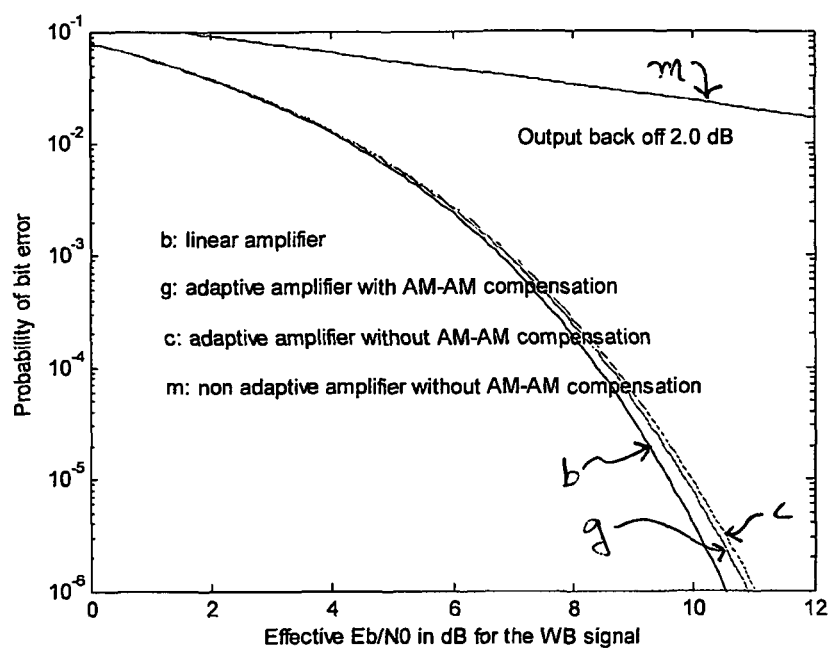
FIG. 20 illustrates plots of probability of bit error $P_e$ for the WB signal versus $(E_b/N_0)_{WB}$ with and without compensation for an output back off of 2 dB.
Figure 21:
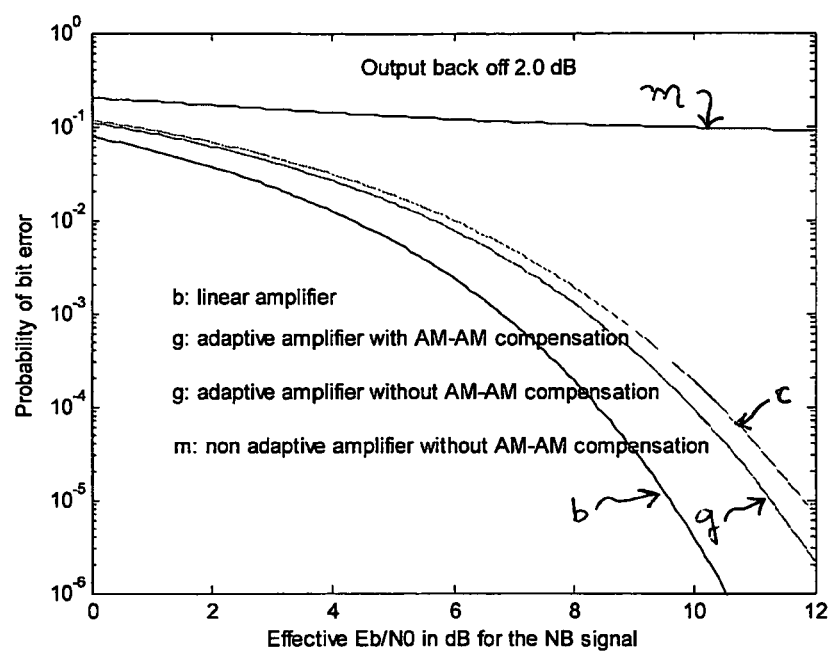
FIG. 21 illustrates plots of probability of bit error $P_e$ for the NB signal versus $(E_b/N_0)_{NB}$ with and without compensation for an output back off of 2 dB.

FIGS. 20 and 21 plot the probability of bit error results for the WB and NB signals, respectively, when the output back off is 2 dB and with $N_a$=7. As may be inferred from FIG. 20, there is only a small fraction of dB degradation compared to the case of an ideal linear amplifier for the WB signal when only the AM-PM compensation is used or when both AM-PM and AM-AM compensations are used. As expected, the performance with no compensation is extremely poor. As shown in FIG. 21, the AM-AM compensation improves the result over that provided by AM-PM compensation by about 0.4 dB for a $P_e$ of about $10^{-5}$. For a $P_e$ of about $10^{-2}$, the compensated system requires about 1.1 dB more than the ideal case. The AM-AM compensation increases the output power by about 0.85 dB for the same input power level due to the AM-AM compensation.

Figure 22:
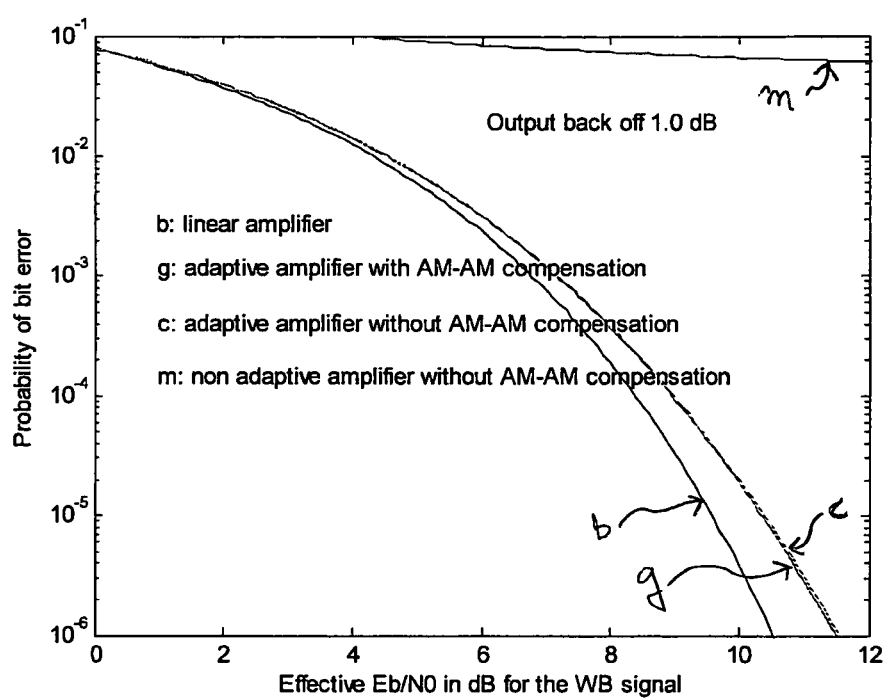
FIG. 22 illustrates plots of probability of bit error $P_e$ for the WB signal versus $(E_b/N_0)_{WB}$ with and without compensation for an output back off of 1 dB.
Figure 23:
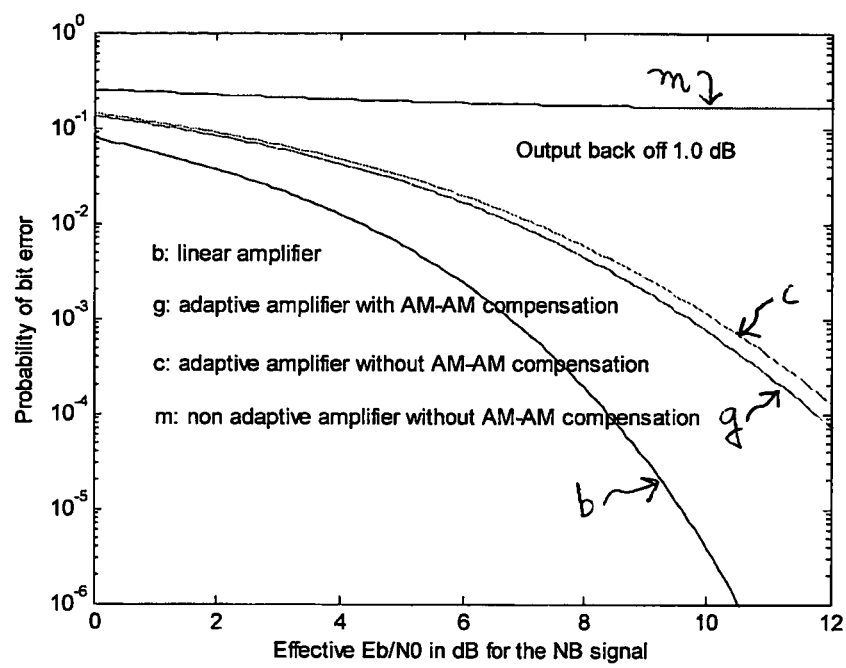
FIG. 23 illustrates plots of probability of bit error $P_e$ for the NB signal versus $(E_b/N_0)_{NB}$ with and without compensation for an output back off of 1 dB.

FIGS. 22 and 23 plot the probability of bit error results for the WB and NB signals, respectively, when the output back off is 1 dB and with $N_a$=7. For the WB signal, the residual degradation after the compensation for the WB signal is relatively small even with 1 dB output back off.

Figure 24:
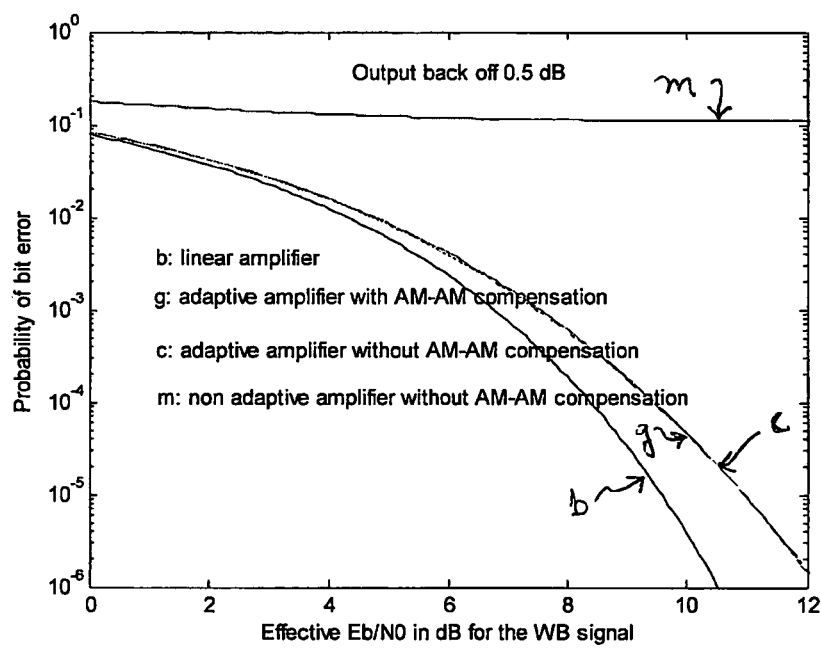
FIG. 24 illustrates plots of probability of bit error $P_e$ for the WB signal versus $(E_b/N_0)_{WB}$ with and without compensation for an output back off of 0.5 dB.
Figure 25:
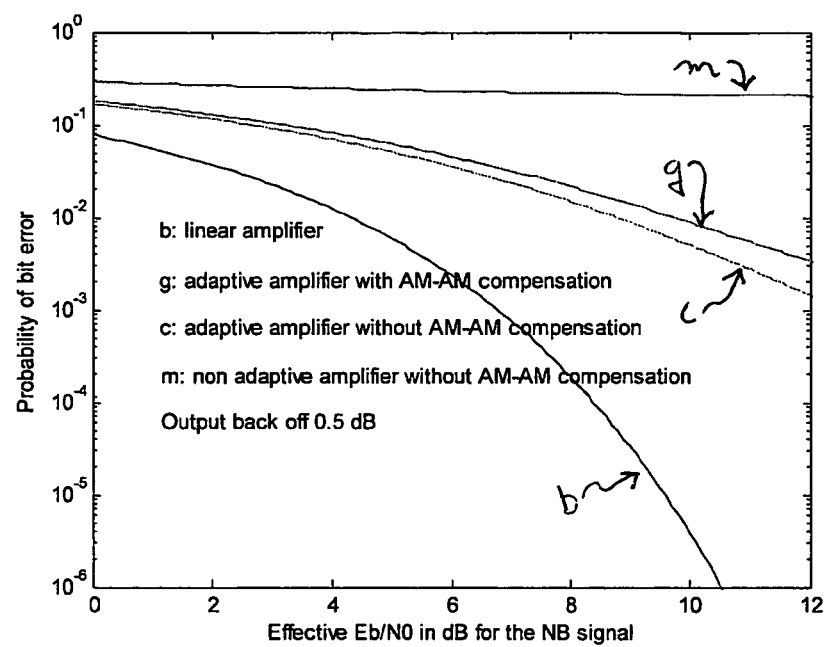
FIG. 25 illustrates plots of probability of bit error $P_e$ for the NB signal versus $(E_b/N_0)_{NB}$ with and without compensation for an output back off of 0.5 dB.

FIGS. 24 and 25 plot the probability of bit error results for the WB and NB signals, respectively, when the output back off is 0.5 dB and with $N_a$=9. For the WB signal, the residual degradation after the compensation for the WB signal is relatively small even with 0.5 dB output back off. For example, for a $P_e$ of $10^{-2}$, the residual degradation in terms of the required $(E_b/N_0)$ for the WB signal is only 0.45 dB compared to the ideal linear amplifier. As may be inferred from FIG. 17, the minimum possible output back off for the TWTA without any compensation is 0.35 dB for the type of input signal used in the simulations. It will thus be appreciated that embodiments of the disclosed architecture result in insignificant degradation in performance compared to the ideal linear amplifier even when operating the amplifier only 0.15 dB back off from the maximum possible output level. Reducing the back off by an additional 0.15 dB is not expected to result in any significant performance difference over that for the 0.5 dB back off. The AM-AM compensation provides an increase of 0.22 dB power compared to the case of no AM-AM compensation for the same input power level in both cases. However, the degradation for the NB signal can be significant for 0.15 dB effective back off unless code requiring a channel error rate of about 0.1 is used, which then requires a $(E_b/N_0)_{NB}$ of about 2.5 dB.

The performance of the NB signal can be improved by increasing $\Delta\Pi_0$ above 0 dB. Such an increase results in a penalty in terms of an effective increase in the required overall $(E_b/N_0)$. The overall increase in the required $(E_b/N_0)$ due to a higher $(E_b/N_0)$ for the NB signal compared to the WB signal by $\Delta\Pi_0$ dB may be represented by:

$$\Delta(E_b/N_0)=10\log\{1+[(10^{0.1\Delta P_0}-1)R_{s2}]/[R_{s1}+R_{s2}]\} \quad (58)$$

From equation (58) for the case considered in the simulation example, $\Delta(E_b/N_0)$ is about 0.19 dB with $(E_b/N_0)_{NB}-(E_b/N_0)_{WB}=3$ dB. With the difference in the $(E_b/N_0)$ of the two signals equal to 6 dB, $\Delta(E_b/N_0)=0.53$ dB. Thus, the amplifier may be operated at saturation even with two signals at its input with only a minimal increase in the overall required $(E_b/N_0)$.

Figure 26:
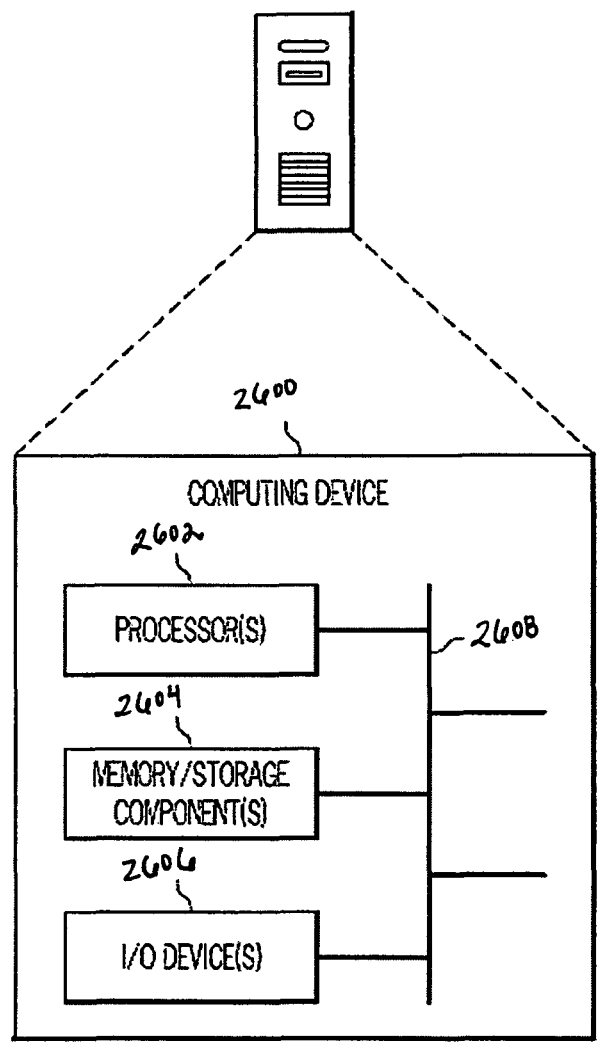
FIG. 26 illustrates a computing device according to one embodiment.

It will be appreciated by one of ordinary skill in the art that at least some of the embodiments described herein or parts thereof may be implemented using hardware, firmware and/or software. The firmware and software may be implemented using any suitable computing device(s). FIG. 26 shows an example of a computing device 2600 according to one embodiment. For the sake of clarity, the computing device 2600 is illustrated and described here in the context of a single computing device. However, it is to be appreciated and understood that any number of suitably configured computing devices 2600 can be used to implement a described embodiment. It will also be appreciated that one such device or multiple devices may be shared in a time division multiplex mode among compensators for multiple power amplifiers, as may be the case, for example, in a base station of a mobile communication network. For example, in at least some implementations, multiple communicatively linked computing devices 2600 are used. One or more of these devices can be communicatively linked in any suitable way such as via one or more networks. One or more networks can include, without limitation: the Internet, one or more local area networks (LANs), one or more wide area networks (WANs), or any combination thereof.

In this example, the computing device 2600 comprises one or more processor circuits or processing units 2602, one or more memory circuits and/or storage circuit component(s) 2604 and one or more input/output (I/O) circuit devices 2606. Additionally, the computing device 2600 comprises a bus 2608 that allows the various circuit components and devices to communicate with one another. The bus 2608 represents one or more of any of several types of bus structures, including a memory bus or memory controller, a peripheral bus, an accelerated graphics port, and a processor or local bus using any of a variety of bus architectures. The bus 2608 may comprise wired and/or wireless buses.

The processing unit 2602 may be responsible for executing various software programs such as system programs, applications programs, and/or program modules/blocks to provide computing and processing operations for the computing device 2600. The processing unit 2602 may be responsible for performing various voice and data communications operations for the computing device 2600 such as transmitting and receiving voice and data information over one or more wired or wireless communications channels. Although the processing unit 2602 of the computing device 2600 is shown in the context of a single processor architecture, it may be appreciated that the computing device 2600 may use any suitable processor architecture and/or any suitable number of processors in accordance with the described embodiments. In one embodiment, the processing unit 2602 may be implemented using a single integrated processor.

The processing unit 2602 may be implemented as a host central processing unit (CPU) using any suitable processor circuit or logic device (circuit), such as a general purpose processor. The processing unit 2602 also may be implemented as a chip multiprocessor (CMP), dedicated processor, embedded processor, media processor, input/output (I/O) processor, co-processor, microprocessor, controller, microcontroller, application specific integrated circuit (ASIC), field programmable gate array (FPGA), programmable logic device (PLD), or other processing device in accordance with the described embodiments.

As shown, the processing unit 2602 may be coupled to the memory and/or storage component(s) 2604 through the bus 2608. The bus 2608 may comprise any suitable interface and/or bus architecture for allowing the processing unit 2602 to access the memory and/or storage component(s) 2604. Although the memory and/or storage component(s) 2604 may be shown as being separate from the processing unit 2602 for purposes of illustration, it is worthy to note that in various embodiments some portion or the entire memory and/or storage component(s) 2604 may be included on the same integrated circuit as the processing unit 2602. Alternatively, some portion or the entire memory and/or storage component(s) 2604 may be disposed on an integrated circuit or other medium (e.g., hard disk drive) external to the integrated circuit of the processing unit 2602. In various embodiments, the computing device 2600 may comprise an expansion slot to support a multimedia and/or memory card, for example.

The memory and/or storage component(s) 2604 represent one or more computer-readable media. The memory and/or storage component(s) 2604 may be implemented using any computer-readable media capable of storing data such as volatile or non-volatile memory, removable or non-removable memory, erasable or non-erasable memory, writeable or re-writeable memory, and so forth. The memory and/or storage component(s) 2604 may comprise volatile media (e.g., random access memory (RAM)) and/or nonvolatile media (e.g., read only memory (ROM), Flash memory, optical disks, magnetic disks, and the like). The memory and/or storage component(s) 2604 may comprise fixed media (e.g., RAM, ROM, a fixed hard drive, etc.) as well as removable media (e.g., a Flash memory drive, a removable hard drive, an optical disk). Examples of computer-readable storage media may include, without limitation, RAM, dynamic RAM (DRAM), Double-Data-Rate DRAM (DDRAM), synchronous DRAM (SDRAM), static RAM (SRAM), read-only memory (ROM), programmable ROM (PROM), erasable programmable ROM (EPROM), electrically erasable programmable ROM (EEPROM), flash memory (e.g., NOR or NAND flash memory), content addressable memory (CAM), polymer memory (e.g., ferroelectric polymer memory), phase-change memory, ovonic memory, ferroelectric memory, silicon-oxide-nitride-oxide-silicon (SONOS) memory, magnetic or optical cards, or any other type of media suitable for storing information.

The one or more I/O devices 2606 allow a user to enter commands and information to the computing device 2600, and also allow information to be presented to the user and/or other components or devices. Examples of input devices include data ports, ADCs, DACs, a keyboard, a cursor control device (e.g., a mouse), a microphone, a scanner, and the like.

Examples of output devices include data ports, ADCs, DACs, a display device (e.g., a monitor or projector, speakers, a printer, a network card). The computing device 2600 may comprise an alphanumeric keypad coupled to the processing unit 2602. The keypad may comprise, for example, a QWERTY key layout and an integrated number dial pad. The computing device 2600 may comprise a display coupled to the processing unit 2602. The display may comprise any suitable visual interface for displaying content to a user of the computing device 2600. In one embodiment, for example, the display may be implemented by a liquid crystal display (LCD) such as a touch-sensitive color (e.g., 76-bit color) thin-film transistor (TFT) LCD screen. The touch-sensitive LCD may be used with a stylus and/or a handwriting recognizer program.

The processing unit 2602 may be arranged to provide processing or computing resources to the computing device 2600. For example, the processing unit 2602 may be responsible for executing various software programs including system programs such as operating system (OS) and application programs. System programs generally may assist in the running of the computing device 2600 and may be directly responsible for controlling, integrating, and managing the individual hardware components of the computer system. The OS may be implemented, for example, as a Microsoft® Windows OS, Symbian OS™, Embedix OS, Linux OS, Binary Run-time Environment for Wireless (BREW) OS, JavaOS, or other suitable OS in accordance with the described embodiments. The computing device 2600 may comprise other system programs such as device drivers, programming tools, utility programs, software libraries, application programming interfaces (APIs), and so forth.

Various embodiments may be described herein in the general context of computer executable instructions, such as software or program modules/blocks, being executed by a computer. Generally, program modules/blocks include any software element arranged to perform particular operations or implement particular abstract data types. Software can include routines, programs, objects, components, data structures and the like that perform particular tasks or implement particular abstract data types. An implementation of these modules/blocks or components and techniques may be stored on and/or transmitted across some form of computer-readable media. In this regard, computer-readable media can be any available medium or media used to store information and accessible by a computing device. Some embodiments also may be practiced in distributed computing environments where operations are performed by one or more remote processing devices that are linked through a communications network. In a distributed computing environment, program modules/blocks may be located in both local and remote computer storage media including memory storage devices.

Although some embodiments may be illustrated and described as comprising functional component or modules/blocks performing various operations, it can be appreciated that such components or modules/blocks may be implemented by one or more hardware components, software components, and/or combination thereof. The functional components and/or modules/blocks may be implemented, for example, by logic (e.g., instructions, data, and/or code) to be executed by a logic device (e.g., processor). Such logic may be stored internally or externally to a logic device on one or more types of computer-readable storage media. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSPs), field programmable gate array (FPGA), logic gates, registers, semiconductor devices, chips, microchips, chip sets, and so forth. Examples of software may include software components, programs, applications, computer programs, application programs, system programs, machine programs, operating system software, middleware, firmware, software modules/blocks, routines, subroutines, functions, methods, procedures, software interfaces, application program interfaces (API), instruction sets, computing code, computer code, code segments, computer code segments, words, values, symbols, or any combination thereof. Determining whether an embodiment is implemented using hardware elements and/or software elements may vary in accordance with any number of factors, such as desired computational rate, power levels, heat tolerances, processing cycle budget, input data rates, output data rates, memory resources, data bus speeds, and other design or performance constraints.

It also is to be appreciated that the described embodiments illustrate example implementations, and that the functional components and/or modules/blocks may be implemented in various other ways which are consistent with the described embodiments. Furthermore, the operations performed by such components and/or modules/blocks may be combined and/or separated for a given implementation and may be performed by a greater number or fewer number of components and modules/blocks.

It is worthy to note that any reference to "one embodiment" or "an embodiment" means that a particular feature, structure, or characteristic described in connection with the embodiment is included in at least one embodiment. The appearances of the phrase "in one embodiment" in the specification are not necessarily all referring to the same embodiment.

Unless specifically stated otherwise, it may be appreciated that terms such as "processing," "computing," "calculating," "determining," or the like, refer to the action and/or processes of a computer or computing system, or similar electronic computing device, that manipulates and/or transforms data represented as physical quantities (e.g., electronic) within registers and/or memories into other data similarly represented as physical quantities within the memories, registers or other such information storage, transmission, or display devices.

While certain features of the embodiments have been illustrated as described above, many modifications, substitutions, changes, and equivalents will now occur to those skilled in the art. It is therefore to be understood that the appended claims are intended to cover all such modifications and changes as fall within the scope of the embodiments.

A first method for pre-processing a signal prior to receipt of the signal by a NLD to compensate for AM-AM distortion and AM-PM distortion of the signal by the NLD is disclosed hereinabove. In one embodiment, the first method includes: generating, by at least one processor, a modified amplitude $r_k$ based on an amplitude $x_k$ derived from a digitized envelope $R_{i,k}$ of the signal; generating, by the at least one processor, a scale factor $c_k$ based on the modified amplitude $r_k$ and the amplitude $x_k$; generating, by the at least one processor, an AM-AM compensated signal based on the scale factor $c_k$; generating, by the at least one processor, a first AM-PM phase compensation value based on the modified amplitude $r_k$; and generating, by the at least one processor, an AM-AM/AM-PM compensated signal by modifying a phase of the AM-AM compensated signal based on the first AM-PM phase compensation value. In certain embodiments of the first method, the signal is a complex baseband signal, and a digitized representation of the signal includes an inphase signal component $u_{i,k}$ and a quadrature signal component $v_{i,k}$. In one such embodiment, the AM-AM compensated signal includes an inphase signal component $u_{p,k}$ and a quadrature signal component $v_{p,k}$, and the step of generating an AM-AM compensated signal includes determining $u_{p,k}$ as the product $c_k \times u_{i,k}$ and $v_{p,k}$ as the product $c_k \times v_{i,k}$.

In certain embodiments of the first method, the signal is an RF signal or an IF signal. In one such embodiment, the step of generating an AM-AM compensated signal includes multiplying the signal by an analog representation of the scale factor $c_k$.

In certain embodiments of the first method, the step of generating a modified amplitude $r_k$ includes evaluating a function $B(x_k)$ to generate $r_k$. B may be an inverse function of an amplitude transfer function h of the NLD.

In certain embodiments of the first method, the step of generating a scale factor $c_k$ includes determining $$\frac{r_k}{x_k}.$$

In certain embodiments of the first method, the step of generating a first AM-PM phase compensation value includes: determining coefficient values of a polynomial $\phi$ of degree $n_p$ that approximates an amplitude to phase transfer function of the NLD; and evaluating $\phi(r_k)$, wherein $\phi(r_k)$ is equal to the first AM-PM phase compensation value. The degree $n_p$ of $\phi$ may be 2 or 3 in certain embodiments. The step of generating a first AM-PM phase compensation value may further include, in certain embodiments: estimating a nominal operating amplitude $A_{0,n}$ based on an average value of the modified amplitude $r_k$ over each of a number of time intervals $T_I$; and adaptively updating coefficient values of $\phi$ such that $\phi$ approximates the amplitude to phase transfer function of the NLD about the nominal operating amplitude $A_{0,n}$.

In certain embodiments, the first method further includes: generating a second AM-PM phase compensation value by evaluating a function $\hat{\psi}_k(r_k)$; and generating an AM-AM and AM-PM compensated signal by modifying a phase of the AM-AM compensated signal based on the second AM-PM phase compensation value. $\hat{\psi}_k$ may be a polynomial function of degree $n_q$ and model a phase error $\psi_k$ caused by at least one of: (1) environmentally-induced variations in an amplitude to phase transfer function of the NLD, (2) time-dependent variations in an amplitude to phase transfer function of the NLD, and (3) an unmodeled nonlinearity of the NLD. Coefficient values of $\hat{\psi}_k$ may be adaptively determined using a gradient algorithm for minimizing error between $\hat{\psi}_k$ and $\psi_k$.

In certain embodiments, the first method further includes: iteratively determining coefficient values of B using a gradient algorithm for minimizing error between an input amplitude x and $h(B(x))$; and terminating the iterative determination when $h(B(x))$ is substantially linear over a range of x. B may be a polynomial of degree $N_a$. In certain embodiments of the first method, the degree $N_a$ of B is an odd number. For example, the degree $N_a$ of B may selected from the group consisting of 3, 5, 7 and 9 in certain embodiments.

In certain embodiments, the first method further includes limiting B to a constant value $A_p$ for values of $x > A_{th}$, wherein $A_{th}$ is a minimum value of x for which $h(B(x))$ is substantially equal to a saturation amplitude $A_s$.

In certain embodiments, the first method further includes, based on changes in an average value of the modified amplitude $r_k$ over a number of time intervals $T_I$, adaptively modifying the degree $N_a$ of B.

A second method for pre-processing a signal prior to receipt of the signal by a NLD to compensate for AM-AM distortion and AM-PM distortion of the signal by the NLD is disclosed hereinabove. In one embodiment the second method includes compensating, by at least one processor, an AM-AM distortion of the signal based on a scale factor $$\frac{r_k}{x_k}.$$

$x_k$ may be an amplitude derived from a digitized envelope $R_{i,k}$ of the signal, and $r_k$ may be a modified amplitude determined by a function $B(x_k)$. B may be a polynomial function of degree $N_a$ and an inverse function of an amplitude transfer function h of the NLD. The second method further includes compensating, by at least one processor, an AM-PM distortion of the signal based on a first AM-PM phase compensation value determined by a function $\phi(r_k)$. $\phi$ may be a polynomial of degree $n_p$ approximating the amplitude to phase transfer function of the NLD about a nominal operating amplitude $A_{0,n}$ of $r_k$.

In certain embodiments the second method further includes: generating a second AM-PM phase compensation value determined by a function $\hat{\psi}_k(r_k)$; and compensating, by at least one processor, the AM-PM distortion of the signal based on the second AM-PM phase compensation value. $\hat{\psi}_k$ may be a polynomial function of degree $n_q$ and model a phase error $\psi_k$ caused by at least one of (1) environmentally-induced variations in an amplitude to phase transfer function of the NLD, (2) time-dependent variations in an amplitude to phase transfer function of the NLD, and (3) an unmodeled nonlinearity of the NLD. Coefficient values of $\hat{\psi}_k$ may be adaptively determined using a gradient algorithm for minimizing error between $\hat{\psi}_k$ and $\psi_k$.

Also disclosed hereinabove is a system that, in one embodiment, includes a non-linear electronic signal processing device for processing an input signal, and a pre-processor in communication with the non-linear electronic signal processing device. The non-linear electronic signal processing device may have a non-linear transfer function. In certain embodiments, the non-linear electronic signal processing device may be a power amplifier. In other embodiments, the non-linear electronic signal processing device may include a cascade of multiple signal processing devices. In one such embodiment, at least one device in the cascade of multiple signal processing devices may be a power amplifier.

The pre-processor may receive a signal, process the received signal, and output the processed signal to an input of the non-linear electronic signal processing device. The pre-processor may include at least one processor programmed to: generate a modified amplitude $r_k$ based on an amplitude $x_k$ derived from a digitized envelope $R_{i,k}$ of the signal; generate a scale factor $c_k$ based on the modified amplitude $r_k$ and the amplitude $x_k$; generate an AM-AM compensated signal based on the scale factor $c_k$; generate a first AM-PM phase compensation value based on the modified amplitude $r_k$; and generate an AM-AM and AM-PM compensated signal by modifying a phase of the AM-AM compensated signal based on the first AM-PM phase compensation value.

In certain embodiments the processor(s) may be further programmed to: store a polynomial function B of degree $N_a$ and evaluate $B(x_k)$, wherein $B(x_k)=r_k$. B may be an inverse function of an amplitude transfer function h of the non-linear electronic signal processing device. In certain embodiments, the degree $N_a$ of B may be an odd number. For example, the degree $N_a$ of B may be selected from the group consisting of 3, 5, 7 and 9 in certain embodiments. In certain embodiments, the degree $N_a$ of B may be based on changes in an average value of the modified amplitude $r_k$ over a number of time intervals $T_I$.

In certain embodiments, the processor(s) may be further programmed to: store a polynomial $\phi$ of degree $n_p$ that approximates an amplitude to phase transfer function of the non-linear electronic signal processing device; and evaluate $\phi(r_k)$, wherein $\phi(r_k)$ is equal to the first AM-PM phase compensation value. In certain embodiments, the degree $n_p$ of $\phi$ may be selected from the group consisting of 2 and 3.

In certain embodiments, the processor(s) may be further programmed to: estimate a nominal operating amplitude $A_{0,n}$ based on an average value of the modified amplitude $r_k$ over each of a number of time intervals $T_I$; and adaptively update coefficient values of $\phi$ such that $\phi$ approximates the amplitude to phase transfer function of the non-linear electronic signal processing device about the nominal operating amplitude $A_{0,n}$.

In certain embodiments, the processor(s) may be further programmed to: generate a second AM-PM phase compensation value by evaluating a function $\hat{\psi}_k(r_k)$; and generate the AM-AM and AM-PM compensated signal by modifying the phase of the AM-AM compensated signal based on the second AM-PM phase compensation value. $\hat{\psi}_k$ may be a polynomial function of degree $n_q$ and model a phase error $\psi_k$ caused by at least one of: (1) environmentally-induced variations in an amplitude to phase transfer function of the non-linear electronic signal processing device, (2) time-dependent variations in an amplitude to phase transfer function of the non-linear electronic signal processing device, and (3) an unmodeled nonlinearity of the non-linear electronic signal processing device. Coefficient values of $\hat{\psi}_k$ may be adaptively determined using a gradient algorithm for minimizing error between $\hat{\psi}_k$ and $\psi_k$.

What is claimed is:

1. A method for pre-processing a signal prior to receipt of the signal by a non-linear device (NLD) to compensate for AM-AM distortion and AM-PM distortion of the signal by the NLD, the method comprising:
generating, by at least one processor, a modified amplitude $r_k$ based on an amplitude $x_k$ derived from a digitized envelope $R_{i,k}$ of the signal, wherein generating the modified amplitude $r_k$ comprises estimating the inverse B of an amplitude transfer function h of the NLD obtained by an optimization of at least one parameter of B found by minimizing a measure of error between $x_k$ and $h(B(x_k))$;
generating, by the at least one processor, a scale factor $c_k$ based on the modified amplitude $r_k$ and the amplitude $x_k$;
generating, by the at least one processor, an AM-AM compensated signal based on the scale factor $c_k$;
generating, by the at least one processor, a first AM-PM phase compensation value based on the modified amplitude $r_k$; and
generating, by the at least one processor, an AM-AM/AM-PM compensated signal by modifying a phase of the AM-AM compensated signal based on the first AM-PM phase compensation value.

2. The method of claim 1, wherein the signal is a complex baseband signal, and wherein a digitized representation of the signal comprises an inphase signal component $u_{i,k}$ and a quadrature signal component $v_{i,k}$.

3. The method of claim 2, wherein the AM-AM compensated signal comprises an inphase signal component $u_{p,k}$ and a quadrature signal component $v_{p,k}$, and wherein generating an AM-AM compensated signal comprises determining $u_{p,k}$ as the product $c_k \times u_{i,k}$ and $v_{p,k}$ as the product $c_k \times v_{i,k}$.

4. The method of claim 1, wherein the signal is an RF signal or an IF signal.

5. The method of claim 4, wherein generating an AM-AM compensated signal comprises multiplying the signal by an analog representation of the scale factor $c_k$.

6. The method of claim 1, further comprising:
iteratively determining coefficient values of B using a gradient algorithm for minimizing error between an input amplitude x and $h(B(x))$, wherein B is a polynomial of degree $N_a$; and
terminating the iterative determination when $h(B(x))$ is substantially linear over a range of x.

7. The method of claim 6, further comprising:
limiting B to a constant value $A_p$ for values of $x > A_{th}$, wherein $A_{th}$ is a minimum value of x for which $h(B(x))$ is substantially equal to a saturation amplitude $A_s$.

8. The method of claim 6, wherein the degree $N_a$ of B is an odd number.

9. The method of claim 8, wherein the degree $N_a$ of B is selected from the group consisting of 3, 5, 7 and 9.

10. The method of claim 6, further comprising:
based on changes in an average value of the modified amplitude $r_k$ over a number of time intervals $T_I$, adaptively modifying the degree $N_a$ of B.

11. The method of claim 1, wherein generating the scale factor $c_k$ comprises determining $$\frac{r_k}{x_k}.$$

12. The method of claim 1, wherein generating the first AM-PM phase compensation value comprises:
determining coefficient values of a polynomial $\phi$ of degree $n_p$, the polynomial $\phi$ approximating an amplitude to phase transfer function of the NLD; and
evaluating $\phi(r_k)$, wherein $\phi(r_k)$ is equal to the first AM-PM phase compensation value.

13. The method of claim 12, wherein generating a first AM-PM phase compensation value comprises:
estimating a nominal operating amplitude $A_{0,n}$ based on an average value of the modified amplitude $r_k$ over each of a number of time intervals $T_I$; and
adaptively updating coefficient values of $\phi$ such that $\phi$ approximates the amplitude to phase transfer function of the NLD about the nominal operating amplitude $A_{0,n}$.

14. The method of claim 12, wherein the degree $n_p$ of $\phi$ is selected from the group consisting of 2 and 3.

15. The method of claim 1, comprising:
generating a second AM-PM phase compensation value by evaluating a function $\hat{\psi}_k(r_k)$, wherein $\hat{\psi}_k$ is a polynomial function of degree $n_q$ and models a phase error $\psi_k$ caused by at least one of: (1) environmentally-induced variations in an amplitude to phase transfer function of the NLD, (2) time-dependent variations in an amplitude to phase transfer function of the NLD, and (3) an unmodeled nonlinearity of the NLD, and wherein coefficient values of $\hat{\psi}_k$ are adaptively determined using a gradient algorithm for minimizing error between $\hat{\psi}_k$ and $\psi_k$; and
generating an AM-AM and AM-PM compensated signal by modifying a phase of the AM-AM compensated signal based on the second AM-PM phase compensation value.

16. The method of claim 1, further comprising estimating a nominal operating amplitude $A_{0,n}$ based on an average value of the modified amplitude $r_k$ over each of a number of time intervals $T_1$.

17. The method of claim 1, wherein the signal is an RF signal, further comprising generating the IF signal, and wherein generating the IF signal comprises:
coupling an input RF signal through an RF coupler, an IF down converter, and an IF bandpass filter to generate the signal; and
applying an envelope detector to generate the envelope $R_{i,k}$ of the signal.

18. A method for pre-processing a signal prior to receipt of the signal by a non-linear device (NLD) to compensate for AM-AM distortion and AM-PM distortion of the signal by the NLD, the method comprising:
compensating, by at least one processor, an AM-AM distortion of the signal based on a scale factor $$\frac{r_k}{x_k},$$

wherein $x_k$ is an amplitude derived from a digitized envelope $R_{i,k}$ of the signal, and wherein $r_k$ is a modified amplitude determined by a function $B(x_k)$, wherein B is a polynomial function of degree $N_a$ and an inverse function of an amplitude transfer function h of the NLD; and
compensating, by at least one processor, an AM-PM distortion of the signal based on a first AM-PM phase compensation value determined by a function $\phi(r_k)$, wherein $\phi$ is a polynomial of degree $n_p$ approximating the amplitude to phase transfer function of the NLD about a nominal operating amplitude $A_{0,n}$ of $r_k$.

19. The method of claim 18, comprising adaptively modifying the degree $N_a$ of B based on changes in an average value of the modified amplitude $r_k$ over a number of time intervals $T_I$.

20. The method of claim 18, comprising generating a second AM-PM phase compensation value determined by a function $\hat{\psi}_k(r_k)$, wherein $\hat{\psi}_k$ is a polynomial function of degree $n_q$ and models a phase error $\psi_k$ caused by at least one of: (1) environmentally-induced variations in an amplitude to phase transfer function of the NLD, (2) time-dependent variations in an amplitude to phase transfer function of the NLD, and (3) an unmodeled nonlinearity of the NLD, and wherein coefficient values of $\hat{\psi}_k$ are adaptively determined using a gradient algorithm for minimizing error between $\hat{\psi}_k$ and $\psi_k$; and
compensating, by at least one processor, the AM-PM distortion of the signal based on the second AM-PM phase compensation value.

21. A system, comprising:
a non-linear electronic signal processing device for processing an input signal, wherein the non-linear electronic signal processing device has a non-linear transfer function; and
a pre-processor in communication with the non-linear electronic signal processing device, wherein the pre-processor receives a signal, processes the received signal, and outputs the processed signal to an input of the non-linear electronic signal processing device, wherein the pre-processor comprises at least one processor programmed to:
generate a modified amplitude $r_k$ based on an amplitude $x_k$ derived from a digitized envelope $R_{i,k}$ of the signal, wherein generating a modified amplitude $r_k$ comprises estimating the inverse B of an amplitude transfer function h of the NLD obtained by an optimization of at least one par der of B found by minimizing a measure of error between $x_k$ and $h(B(x_k))$;
generate a scale factor $c_k$ based on the modified amplitude $r_k$ and the amplitude $x_k$;
generate an AM-AM compensated signal based on the scale factor $c_k$;
generate a first AM-PM phase compensation value based on the modified amplitude $r_k$; and
generate an AM-AM and AM-PM compensated signal by modifying a phase of the AM-AM compensated signal based on the first AM-PM phase compensation value.

22. The system of claim 21, wherein the least one processor is further programmed to:
store function B, wherein the function B is a polynomial function of degree $N_a$; and
evaluate $B(x_k)$, wherein $B(x_k)=r_k$.

23. The system of claim 22, wherein the degree $N_a$ of B is an odd number.

24. The system of claim 23, wherein the degree $N_a$ of B is selected from the group consisting of 3, 5, 7 and 9.

25. The system of claim 22, wherein the degree $N_a$ of B is based on changes in an average value of the modified amplitude $r_k$ over a number of time intervals $T_I$.

26. The system of claim 21, wherein the least one processor is further programmed to:
store a polynomial $\phi$ of degree $n_p$, the polynomial $\phi$ approximating an amplitude to phase transfer function of the non-linear electronic signal processing device; and
evaluate $\phi(r_k)$, wherein $\phi(r_k)$ is equal to the first AM-PM phase compensation value.

27. The system of claim 26, wherein the at least one processor is further programmed to:
estimate a nominal operating amplitude $A_{0,n}$ based on an average value of the modified amplitude $r_k$ over each of a number of time intervals $T_1$; and
adaptively update coefficient values of $\phi$ such that $\phi$ approximates the amplitude to phase transfer function of the NLD about the nominal operating amplitude $A_{0,n}$.

28. The system of claim 26, wherein the degree $n_p$ of $\phi$ is selected from the group consisting of 2 and 3.

29. The system of claim 21, wherein the at least one processor is further programmed to:
generate a second AM-PM phase compensation value by evaluating a function $\hat{\psi}_k(r_k)$, wherein $\hat{\psi}_k$ is a polynomial function of degree $n_q$ and models a phase error $\psi_k$ caused by at least one of: (1) environmentally-induced variations in an amplitude to phase transfer function of the non-linear electronic signal processing device, (2) time-dependent variations in an amplitude to phase transfer function of the non-linear electronic signal processing device, and (3) an unmodeled nonlinearity of the non-linear electronic signal processing device, and wherein coefficient values of $\hat{\psi}_k$ are adaptively determined using a gradient algorithm for minimizing error between $\hat{\psi}_k$ and $\psi_k$; and
generate the AM-AM and AM-PM compensated signal by modifying the phase of the AM-AM compensated signal based on the second AM-PM phase compensation value.

30. The system of claim 21, wherein the non-linear electronic signal processing device is a power amplifier.

31. The system of claim 21, wherein the non-linear electronic signal processing device comprises a cascade of multiple signal processing devices.

32. The system of claim 31, wherein at least one of the cascade of multiple signal processing devices is a power amplifier.

* * * * *